(12) United States Patent
Peter et al.

(10) Patent No.: US 11,313,991 B2
(45) Date of Patent: Apr. 26, 2022

(54) DIRECTIONAL CONTROL OF DOWNHOLE COMPONENT USING NMR MEASUREMENTS

(71) Applicants: Andreas Peter, Celle (DE); Thomas Kruspe, Wietzendorf (DE); Sebastian Jung, Isernhagen (DE)

(72) Inventors: Andreas Peter, Celle (DE); Thomas Kruspe, Wietzendorf (DE); Sebastian Jung, Isernhagen (DE)

(73) Assignee: BAKER HUGHES OILFIELD OPERATIONS LLC, Houston, TX (US)

( * ) Notice: Subject to any disclaimer, the term of this patent is extended or adjusted under 35 U.S.C. 154(b) by 29 days.

(21) Appl. No.: 16/867,958

(22) Filed: May 6, 2020

(65) Prior Publication Data
US 2021/0349232 A1 Nov. 11, 2021

(51) Int. Cl.
| | |
|---|---|
| *G01V 3/32* | (2006.01) |
| *G01N 24/08* | (2006.01) |
| *G01R 33/36* | (2006.01) |
| *G01R 33/383* | (2006.01) |
| *G01R 33/54* | (2006.01) |
| *G01R 33/38* | (2006.01) |

(52) U.S. Cl.
CPC ............. *G01V 3/32* (2013.01); *G01N 24/081* (2013.01); *G01R 33/3628* (2013.01); *G01R 33/383* (2013.01); *G01R 33/3808* (2013.01); *G01R 33/543* (2013.01)

(58) Field of Classification Search
CPC .... G01V 3/32; G01R 33/3808; G01R 33/543; G01R 33/383; G01R 33/3628; G01N 24/081
See application file for complete search history.

(56) References Cited

U.S. PATENT DOCUMENTS

| | | | |
|---|---|---|---|
| 7,015,694 | B2 | 3/2006 | Blumich |
| 10,746,009 | B2* | 8/2020 | Hoehn ..................... E21B 44/02 |
| 2009/0015254 | A1* | 1/2009 | Castillo ................. H01F 13/006 324/303 |
| 2018/0347349 | A1* | 12/2018 | Marsala ................... G01V 1/52 |
| 2019/0063205 | A1* | 2/2019 | Omeragic ............ G01V 99/005 |
| 2019/0376386 | A1* | 12/2019 | Wright .................. E21B 49/005 |

* cited by examiner

*Primary Examiner* — Susan S Lee
(74) *Attorney, Agent, or Firm* — Cantor Colburn LLP

(57) ABSTRACT

A system for acquiring directional information about a geologic formation includes at least one directionally sensitive nuclear magnetic resonance (NMR) assembly disposed at a borehole string including the downhole component. The at least one NMR assembly includes at least one magnet configured to generate a static magnetic field and at least one coil configured to generate an oscillating magnetic field, the at least one NMR assembly configured to perform an NMR measurement of at least one sector of a formation region. The system also includes a processing device configured to receive NMR measurement data from the at least one NMR assembly. The processing device is configured to analyze the NMR measurement data to estimate a parameter of the sector, determine a direction of the downhole component based on the estimated parameter; and steer the downhole component according to the determined direction.

20 Claims, 23 Drawing Sheets

DIRECTIONAL CONTROL OF DOWNHOLE COMPONENT USING NMR MEASUREMENTS

BACKGROUND

Various types of drill strings are deployed in a borehole for exploration and production of hydrocarbons. A drill string generally includes drill pipe or other tubular and a bottomhole assembly (BHA). Many drilling operations utilize directional measurements in conjunction with a steering assembly or system to direct a borehole along a desired path, e.g., to target specific formations or productive subterranean regions.

SUMMARY

An embodiment of a system for acquiring directional information about a geologic formation includes at least one directionally sensitive nuclear magnetic resonance (NMR) assembly disposed at a borehole string including the downhole component, the borehole string configured to be deployed in a borehole in an earth formation. The at least one NMR assembly includes at least one magnet configured to generate a static magnetic field and at least one coil configured to generate an oscillating magnetic field, the at least one NMR assembly configured to perform an NMR measurement of at least one sector of a formation region. The system also includes a processing device configured to receive NMR measurement data from the at least one NMR assembly. The processing device is configured to analyze the NMR measurement data to estimate a parameter of the sector, determine a direction of the downhole component based on the estimated parameter; and steer the downhole component according to the determined direction.

An embodiment of a method of acquiring directional information about a geologic formation includes deploying a tool as part of a borehole string in a borehole in an earth formation, the tool including at least one directionally sensitive nuclear magnetic resonance (NMR) assembly. The at least one NMR assembly includes at least one magnet configured to generate a static magnetic field and at least one coil configured to generate an oscillating magnetic field. The method also includes performing an NMR measurement of at least one sector of a formation region by the at least one NMR assembly, the NMR measurement generating NMR measurement data, analyzing the NMR measurement data to estimate a parameter of the at least one sector, determining a direction of the downhole component based on the estimated parameter, and steering the downhole component according to the determined direction.

BRIEF DESCRIPTION OF THE DRAWINGS

The subject matter which is regarded as the invention is particularly pointed out and distinctly claimed in the claims at the conclusion of the specification. The foregoing and other features and advantages of the invention are apparent from the following detailed description taken in conjunction with the accompanying drawings in which:

DETAILED DESCRIPTION

Methods, systems and apparatuses for estimating formation properties and directional control of downhole components are described herein. An embodiment of a measurement and directional control system is configured to acquire formation measurement data indicative of, for example, the porosity of a formation region around a borehole. In one embodiment, the formation measurement data is acquired by one or more directionally sensitive nuclear magnetic resonance (NMR) sensor assemblies, which are used to measure a parameter such as the porosity of the formation at various azimuthal or angular sectors of a formation region around a borehole.

Each NMR sensor assembly includes at least one permanent magnet (or electromagnet) configured to generate a static magnetic field and at least one conductive coil that acts as an antenna to generate an oscillating, high frequency magnetic field. The positioning of the at least one magnet and the at least one coil in relation to each other, and to a body supporting the magnet(s) and coil(s), ensure that the static magnetic field strength in a formation sector (outside of a borehole) and the oscillating field strength in the formation sector have sufficient strength and have an orthogonal component so that NMR measurements are dominated by the characteristics of a formation volume around the borehole.

The measurement and directional control system is configured to estimate the porosity (or other parameter) of the surrounding formation based on NMR measurements, and control a steering assembly or communicate with a steering assembly to steer a downhole component base on the porosity. In one embodiment, one or more NMR assemblies at a borehole location are used to estimate porosity in specific sectors of the formation region around a circumference of the borehole. In order to create an image of the porosity distribution around the circumference of the borehole, an NMR assembly may be rotated, correlating porosity measurement output to a rotational position. Additionally, or alternatively, more than one NMR assembly at the same or similar axial location can be mounted on the borehole string, where each NMR assembly is oriented toward a specific formation sector.

Figure 1:
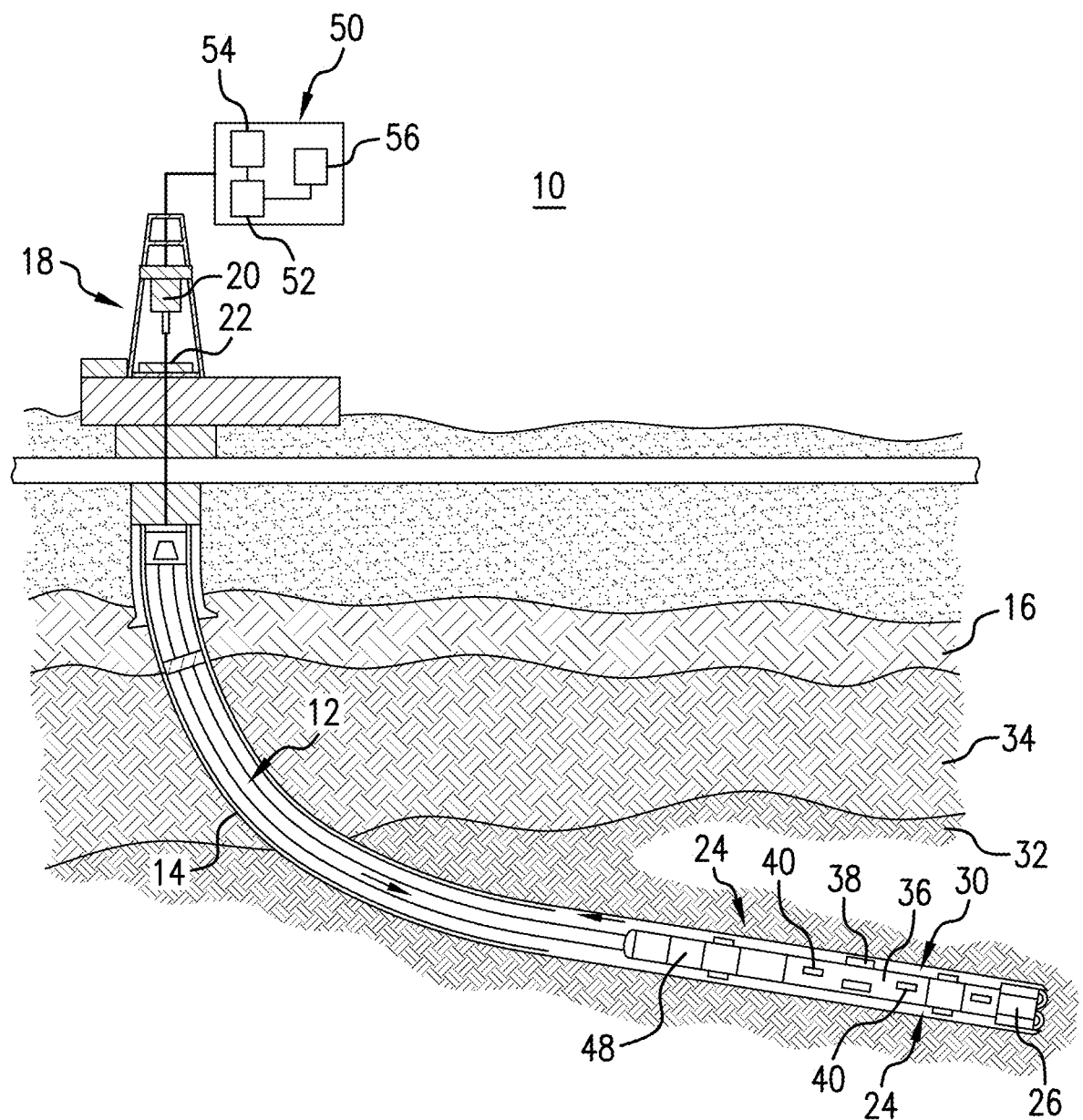
FIG. 1 depicts an embodiment of a drilling and steering system including one or more directionally sensitive nuclear magnetic resonance (NMR) assemblies.

FIG. 1 shows an embodiment of system 10 for performing various downhole operations, such as a drilling and steering operation. In addition, or alternatively, the system 10 may be configured to perform other operations, such as measurement operations (e.g., logging while drilling), stimulation operations and/or production operations. The system 10 includes a borehole string 12 that is shown disposed in a well or borehole 14 that penetrates at least one earth formation 16 (e.g., a resource bearing formation) during a drilling or other downhole operation. As described herein, "borehole" or "wellbore" refers to a hole that makes up all or part of a drilled well. It is noted that the borehole 14 may include vertical, deviated and/or horizontal sections, and may follow any suitable or desired path. As described herein, "formations" refer to the various features and materials that may be encountered in a subsurface environment and surround the borehole 14.

The borehole string 12 is operably connected to a surface structure or surface equipment such as a drill rig 18, which includes or is connected to various components such as a surface drive 20 or rotary table 22 for supporting the borehole string 12, rotating the borehole string 12 and lowering string sections or other downhole components. In one embodiment, the borehole string 12 is a drill string including one or more drill pipe sections that extend downward into the borehole 14, and is connected to one or more downhole components, which may be configured as a bottomhole assembly (BHA) 24.

The BHA 24 includes a drill bit 26, which in this embodiment is driven from the surface, but may be driven from downhole, e.g., by a downhole mud motor. The system 10 may include components to facilitate circulating fluid such as drilling mud through the borehole string 12 and an annulus between the borehole string 12 and the borehole wall.

In the embodiment of FIG. 1, the system 10 includes a steering assembly 30 configured to steer or direct a section of the borehole string 12 and the drill bit 26 along a selected path. The steering assembly 30 allows for steering to maintain the drill bit 26 and the borehole within, e.g., a selected resource bearing formation layer or region. The formation 16 or subterranean region can include multiple formation layers that have different characteristics and different potentials for hydrocarbon production, such as layers 32 and 34. In this example, it is desirable to stay within the layer 32 (a target layer) and avoid crossing into adjacent layers, such as an adjacent layer 34.

The steering assembly 30 may have any configuration suitable to direct or steer the drill string 12. Examples of steering assemblies include steerable motor assemblies (e.g., bent housing motor assemblies), whipstocks, turbines and rotary steerable systems.

For example, the steering assembly 30 is configured as a rotary steering assembly forming part of the BHA 24 or connected to the BHA 24. The steering assembly 30 includes a rotating sleeve 36 that includes one or more radially extendable pads 38 (extendable in a direction perpendicular to a longitudinal axis of the sleeve) that are adjustable in combination to deflect the drill bit 26 by engaging the borehole wall.

In one embodiment, during drilling, the sleeve 36 rotates at a rate that is less than the rotational rate of the drill bit 26 and other components of the steering assembly 30. The rate of rotation of the sleeve is denoted herein as "slow rotation." It is noted that "slow" rotation is intended to indicate a rotational rate that is less than the drilling rotational rate, and is not intended to be limiting to any specific rate.

The sleeve 34 can rotate at any suitable slow rotation rate that is less than the drilling rotation rate. For example, slow rotation of the sleeve 36 is a rate between about 1 and 10 revolutions per hour (RPH), or less than 50 RPH.

The system 10 may include one or more of various tools or components configured to perform selected functions downhole such as performing downhole measurements, facilitating communications, and others. The tools or components may be disposed at any suitable location(s). For example, the system includes a measurement device such as a logging while drilling (LWD) tool or a measurement while drilling (MWD) tool. Examples of such tools include nuclear magnetic resonance (NMR) tools, resistivity tools, gamma (density) tools, pulsed neutron tools and various others.

In one embodiment, the system 10 includes one or more NMR sensor assemblies 40 (also referred to as NMR assemblies) configured to be used to estimate formation properties. The NMR assemblies are part of or in communication with a measurement and directional control system that is configured to acquire NMR measurement data and estimate formation properties in one or more regions around the borehole 14. The measurement and directional control system can then be used to control the direction of the drilling assembly. As discussed further below, the one or more NMR assemblies 40 are part of, or connected to, a steering system such as the steering assembly 30.

For example, during drilling, directional NMR measurements are acquired, and porosity is estimated at one or more angular or azimuthal sectors of a formation region around the borehole. The porosity is used to determine whether the BHA 24 and/or the drill bit 26 is within a desired layer, such as the target layer 32. If the measured porosity is different than the porosity associated with the target layer 32, the measurement and directional control system can determine that the BHA 24 and/or the drill bit 26 are in a different later, or are at or near a boundary between layers. The steering assembly 30 can be operated based on this information to maintain the BHA 24 and/or the drill bit 26 within the target layer 32. It is noted that a "layer" as described herein refers to any subterranean region and is not limited to any particular size, shape, depth or extent.

As is known in the art, a NMR sensing assembly of an NMR tool generates a static magnetic field ($B_0$) by a permanent magnet or coil. An oscillating (e.g., RF) magnetic field ($B_1$), which is at least substantially perpendicular to the static magnetic field, is generated in the volume with, e.g., an RF antenna.

A receiver detects the excited NMR signal and captures its relaxation back to thermal equilibrium. The signal originates from the net magnetization resulting from the superposition of signal from individual hydrogen protons in the formation fluid. These signals are formed using a series of spin echoes (i.e. resulting in an echo train), which are detected by the tool, numerically processed, and ultimately displayed in NMR logs. The amplitude of these spin echoes is detected as a function of time, allowing for detection of both the initial amplitude (i.e. for porosity measurement) and the signal decay, which can be used to derive various formation and fluid characteristics.

There may be any number of NMR sensor assemblies 40, and NMR assemblies 40 can be disposed at any suitable location or part of the borehole string 12. For example, there may be a single directionally sensitive NMR assembly 40 on a rotating component, such as the rotating sleeve 36. In another example, multiple NMR sensor assemblies 40 may be positioned at different angular or azimuthal positions, which can be useful for acquiring NMR measurement data from a non-rotating component or during a non-rotating (e.g., sliding) mode. Each sensor NMR assembly 40 is directionally sensitive, and is oriented and configured to estimate porosity in an azimuthal or angular sector of a formation surrounding the borehole 14. This allows for estimation of porosity changes (e.g., high side vs low side) which allows for steering into a desired formation region.

One or more downhole components, such as the BHA 24, the steering assembly 30 and/or the NMR assemblies 40, may be in communication with and/or controlled by a processor such as a downhole processor 48 and/or a surface processing unit 50. The surface processing unit 50 (and/or the downhole processor 48) may be configured to perform functions such as controlling drilling and steering, controlling the flow rate and pressure of borehole fluid, transmitting and receiving data, processing measurement data, and/or monitoring operations of the system 10. The surface processing unit 50, in one embodiment, includes an input/output (I/O) device 52, a processor 54, and a data storage device 56 (e.g., memory, computer-readable media, etc.) for storing data, models and/or computer programs or software that cause the processor to perform aspects of methods and processes described herein.

In one embodiment, the surface processing unit 50 is configured as a surface control unit which controls various parameters such as rotary speed, weight-on-bit, fluid flow parameters (e.g., pressure and flow rate) and others. The downhole processor 48 may be a directional measurement controller or other processing device that controls aspects of steering, acquiring measurement data and/or estimating directional parameters. The downhole processor 48 may also include functionality for controlling operation of the steering assembly and/or other downhole components.

In the embodiment of FIG. 1, the system 10 is configured to perform a drilling operation and a downhole measurement operation, and the borehole string 12 is a drill string. However, embodiments described herein are not so limited and may have any configuration suitable for performing an energy industry operation that includes or can benefit from directional measurements.

The measurement and directional control system includes at least a processing device or processor such as the surface processing unit 50, which is configured to acquire NMR measurement data and estimate a porosity of at least part of a formation region surrounding the borehole 14. The measurement and directional control system may be considered to include only the processor, or may be considered to include the processor and at least one NMR assembly 40 and/or the steering assembly 30.

Figure 2:
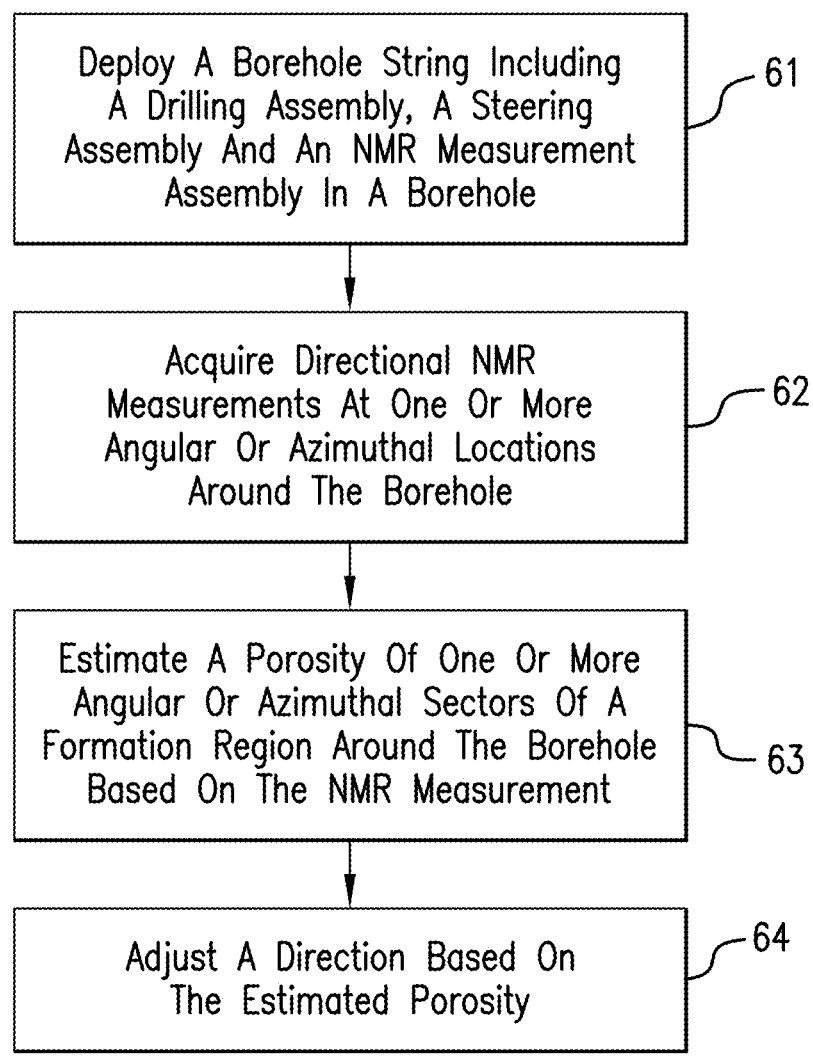
FIG. 2 is a flow chart that depicts an embodiment of a method of performing NMR measurements and controlling a direction of a downhole component.

FIG. 2 illustrates a method 60 of performing NMR measurements, estimating formation properties such as porosity, and controlling a downhole component direction based on the formation properties. The method 60 may be performed in conjunction with the system 10 and one or more NMR sensor assemblies 40 of FIG. 1, but is not limited thereto. The method 60 includes one or more of stages 61-64 described herein, at least portions of which may be performed by a processor (e.g., the surface processing unit 50). In one embodiment, the method 60 includes the execution of all of stages 61-64 in the order described. However, certain stages may be omitted, stages may be added, or the order of the stages changed.

The method 60 is described in conjunction with the system 10 and one or more NMR sensor assemblies 40 of FIG. 1, but is not so limited. The method 60 may be used with any device or system that performs NMR measurements and/or receives NMR measurement data. For example, the system 10 may include one NMR assembly at a given borehole location (e.g., depth), or multiple NMR assemblies at multiple angular locations.

In the first stage 61, a downhole component such as the BHA 24 is deployed into a borehole to a selected location. Drilling is commenced and directed by the steering assembly 30 or other suitable steering mechanism. The steering assembly 30 is controlled to maintain the BHA 24 and the borehole along a desired path. For example, the steering assembly 30 is controlled to keep the borehole within the target formation layer 32.

At a given axial location, there may be a single NMR sensor assembly 40 or multiple assemblies. A configuration using a single NMR assembly can be used when acquiring NMR measurements as the borehole string 12 or component thereof is rotating.

Multiple NMR assemblies 40 can be substantially co-located relative to the longitudinal axis, where each NMR assembly is disposed at a different angular location on the BHA 24 and is oriented to image a different sector of a formation region. For example, if the NMR assemblies are disposed on a component that does not rotate or is not easily rotated (e.g. coiled tubing drilling tools), three or more NMR assemblies may be included, such as three NMR assemblies spaced apart by about 120 degrees.

In the second stage 62, when the NMR assemblies 40 are located at the selected location, NMR measurements are performed by generating a static magnetic field $B_0$ in an angular or azimuthal sector around the borehole by at least one magnet, and generating a pulsed magnetic field $B_1$ in the sector by at least one coil. Generally, each NMR assembly 40 generates a static and oscillating magnet field in a radially direction away from the borehole string. The magnet(s) and coil(s) are positioned relative to one another to ensure that the output of the coil is dominated by the characteristics of a formation sector. A "radial" direction is a direction orthogonal or perpendicular to a longitudinal axis of a body (e.g., a tool, BHA or pipe segment) supporting the magnet(s) and coil(s).

At least one receiving coil (which may be the same or different than the transmitting coil) detects NMR signals from a sector in response to the interaction between the nuclear spins and the static and oscillating magnetic fields, and generates NMR measurement data that includes spin echo trains.

To acquire NMR measurements, bursts of high frequency electro-magnetic energy are sent through the winding of one or more coils to generate an oscillating magnetic field that causes the spin of hydrogen atoms to flip by 90° and subsequently by 180° to enable a CPMG pulse NMR measurement. In one embodiment, similar to the methods used in bulk measurement NMR tools, a transmitter coil is first used to send the spin flipping high frequency bursts, and then used to detect the signals created by the back-flipping hydrogen atoms. The output is usually a decay curve, indicative of the time it takes the hydrogen atoms to relax back into equilibrium and having their spin aligned with the magnetic field direction again. It may be advantageous to alternatively apply methods taught in U.S. Pat. No. 7,015,694, entitled "NMR apparatus and method for stochastic pulsing of earth formations," the entirety of which is incorporated by reference herein.

Stage 62 can be a full image of a sector or can be another type of information. For example, multiple NMR assemblies can allow for determining a porosity contrast or relative porosity between sectors, without creating a real image.

In the third stage 63, characteristics of the formation are estimated. In one embodiment, the NMR measurements (e.g., decay curves) are analyzed to estimate a porosity of a formation sector. NMR measurement data including raw time domain echo trains can be processed to calculate a measured T2 distribution by inverting echo train data into the T2 domain. Based on the T2 distribution, porosity of each sector can be determined.

In the fourth stage 64, the direction of the downhole component is adjusted as desired based on the porosity. The downhole component may be, for example, the BHA 24 and/or the drill bit 26, the direction of which is controlled by the steering assembly 30 or other suitable steering system.

For example, if the porosity is below a threshold value or otherwise deviates from a porosity value associated with a desired formation layer, this may indicate that the BHA 24 is approaching or has entered an adjacent formation layer having a lower porosity. The BHA 24 can then be steered to direct the BHA 24 away from the lower porosity layer and maintain the borehole within the desired formation layer.

In another example, the porosity of each sector is compared to determine whether there is a significant difference between any of the sectors. If there is, the difference may be an indication that the BHA 24 is in a transition region between the desired formation layer (e.g., the target layer 32) and another layer. Based on this information, the BHA 24 can be steered to move the drill bit away from the transition region and further into the desired layer.

Differences between porosity can also give an indication as to the direction of the transition region. By knowing the azimuthal or angular position relative to the borehole, it can be determined which direction to steer the BHA 24. The steering direction may be based on the NMR measurement data and estimated porosity in different sectors. For example, if a lower porosity is detected in a north-facing sector and a higher porosity if detected in a south-facing sector, it can be determined that the desired layer is substantially to the south of the borehole. In response, the BHA 24 can be steered to direct the drill bit toward a southward direction.

FIGS. 3-23 depict various embodiments of a directionally sensitive NMR assembly that can be used to perform the methods discussed herein, which include acquiring an NMR image of a formation region or differences in porosity between sectors (porosity contrast) and controlling the direction of a downhole component based thereon. These embodiments include a permanent magnet (or electro-magnet) configuration that generates a static magnet field $B_0$ that extends into a formation sector. The magnetic field is configured so that a volume of the magnetic field in a formation sector is as large as possible and has a strong magnetic flux density in a formation sector. A "strong" flux density is a flux density high enough to permit a high NMR/Lamor frequency to enable high signal to noise ratio of the NMR spin-echo measurement in a volume of the formation region that is at least a selected radial distance away from the borehole wall. The magnetic field may also be configured to have a relatively low field gradient in the volume. A low field gradient provides a large volume with a relatively low frequency bandwidth, which is helpful to get relatively high signal strength in the receiver. It is noted that the NMR assemblies described herein are not limited to the specific embodiments described.

Also in these embodiments, one or more antennas or coils are positioned relative to the permanent magnet to generate an oscillating (e.g., radio frequency) $B_1$ field that is orthogonal to the $B_0$ field in a sector. The coils are configured so that the field strength of the $B_1$ field is as high as possible in the measurement volume but at least a selected proportion of the field strength of the $B_0$ field in the sector. For example, the coils are configured so that the $B_1$ field strength is at least about 1/1000 of $B_0$.

The NMR assemblies in the following embodiments may be incorporated into the system of FIG. 1 as the NMR assemblies 40, or may be incorporated into any suitable system for which steering a downhole component is desired.

Figure 3:
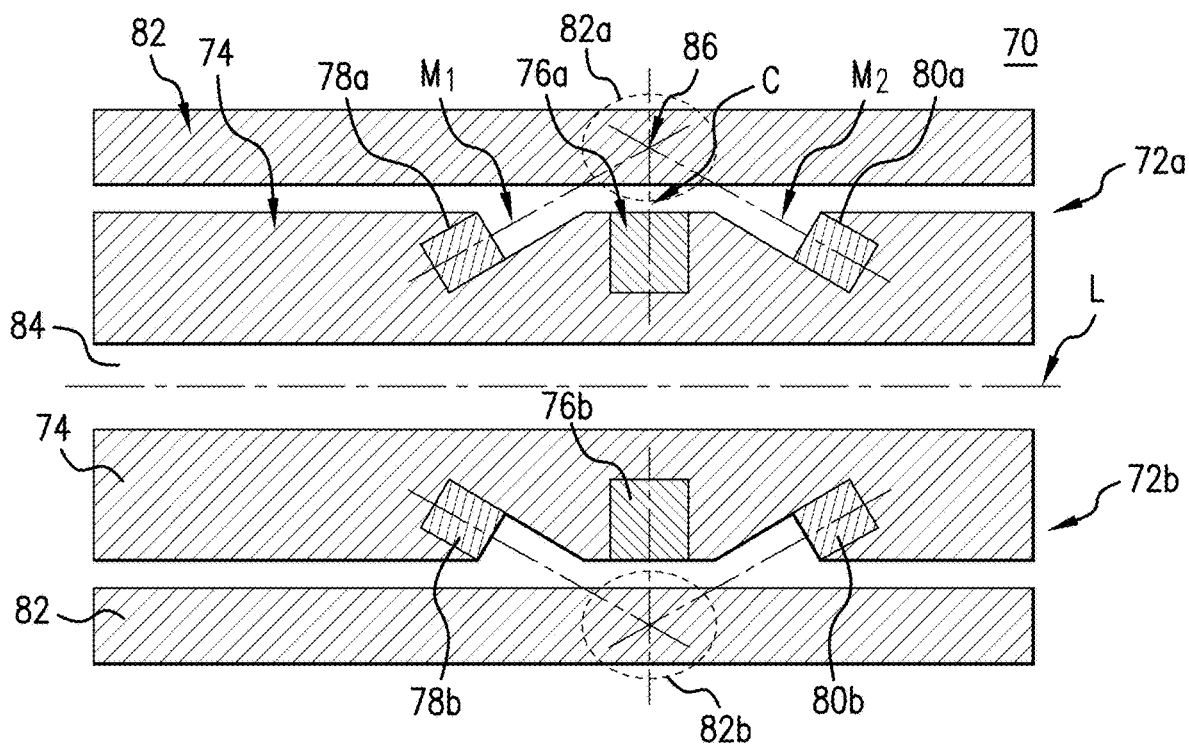
FIG. 3 depicts an embodiment of a directionally sensitive NMR assembly including central coils and opposing permanent magnets.
Figure 4:
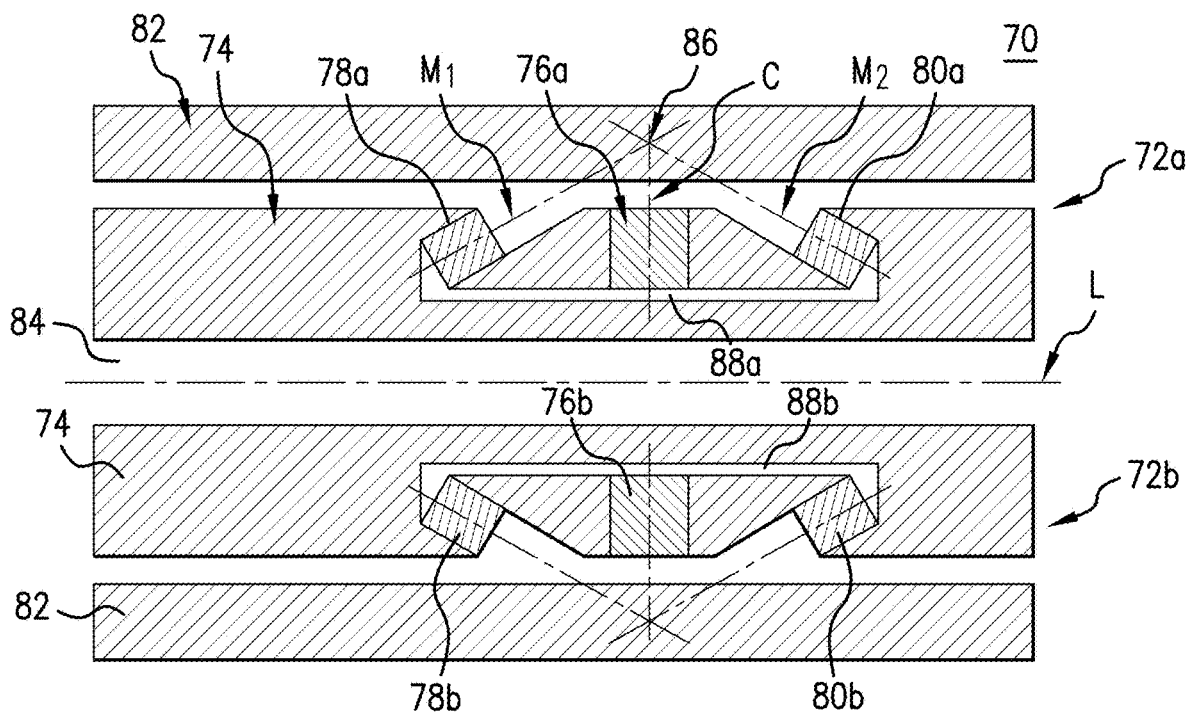
FIG. 4 depicts an embodiment of a directionally sensitive NMR assembly including central coils and opposing permanent magnets disposed on a yoke made from a high magnetic permeability material.
Figure 5:
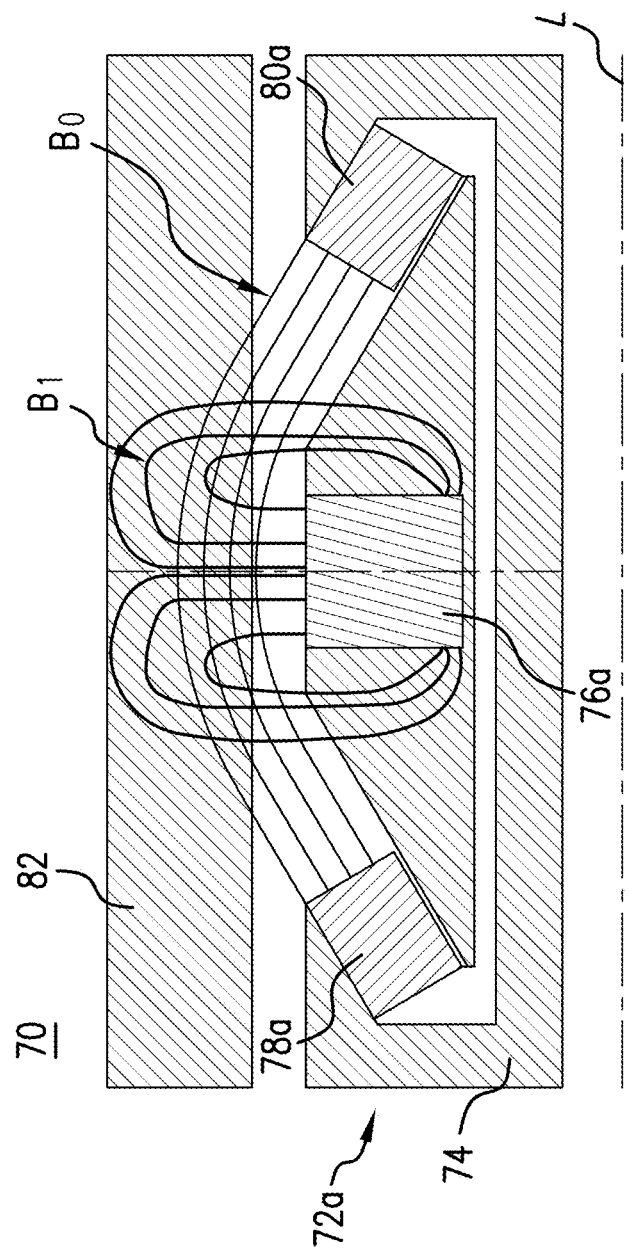
FIG. 5 depicts the NMR assembly of FIG. 4 and illustrates static and oscillating magnetic fields generated within an angular or azimuthal sector of a formation region.

FIGS. 3-5 depict embodiments of a NMR measurement tool 70 that includes directionally sensitive NMR assemblies 72 that can be used to estimate formation characteristics, including porosity, in respective sectors. The NMR measurement tool 70 can be incorporated into any downhole system, such as the system of FIG. 1 (e.g., as an NMR assembly 40). In these embodiments, two NMR assemblies 72 are shown for illustrative purposes at two different angular locations.

In one embodiment, referring to FIG. 3, the tool 70 includes an elongated body 74 configured to support one or more NMR assemblies 72. For example, the elongated body supports two NMR assemblies 72, denoted as an NMR assembly 72a and an NMR assembly 72b. Each NMR assembly 72a and 72b includes a respective coil 76a and 76b. The NMR assembly 72a includes two magnets 78a and 80a, and the NMR assembly 72b includes two magnets 78b and 80b. As shown, the magnets 78a and 80a are disposed axially at opposing sides of the coil 76a, and the magnets 78b and 80b are disposed axially at opposing sides of the coil 76b. The strength of the magnets 78a, 78b and 80a, 80b is selected to be high enough to generate a static magnetic field with sufficient flux density in formation sectors 82a and 82b (in a formation 82) to cause a sufficiently high Larmor-frequency of the spins of hydrogen atoms in the formation.

In this embodiment, the coils 76a and 76b and the magnets 78, 78a and 80, 80a are disposed in corresponding recesses in a wall of the body 74. The body 74 may be a drilling tool, borehole string segment (e.g., a pipe segment), a BHA or any other suitable part of a borehole string deployed into a borehole 84.

The following is a description of an embodiment of a configuration of the NMR assembly 72a. It is to be understood that the NMR assembly 72b may have the same or similar configuration, or may have a different configuration (e.g., direction of orientation, axial location, etc.) than the NMR assembly 72a.

In this embodiment, the coil 76a and the magnets 78a and 80a are oriented at least partially in a radial direction (perpendicular to the longitudinal axis L) so that the axes of the magnets 78a and 80a intersect at intersection 86 outside of the borehole. The axes of the magnets 78a and 80a are denoted as the $M_1$ axis and the $M_2$ respectively. For example, the coil 76a is oriented so that its axis (the C axis) is in the radial direction, and the magnet orientations are at a selected angle from the radial direction (e.g., zero to 90 degrees). The angles are selected so that the magnetic field lines created by the magnets 78a and 80a intersect substantially perpendicular with the field lines created by the coil 76a in the sector 82a. It is noted that the orientations are not limited to those of the embodiments described herein, as the coil 76a and the magnets 78a and 80a may have any suitable orientation that results in substantially orthogonal field line intersection within the sector 82.

The magnets 78a and 80a may be polarized such that the north pole of one magnet is oriented towards the south pole of the other magnet. This arrangement is one option to maximize the magnetic flux present in the volume in the sector 82a. In order to restrict the sensitivity of the coil 76 towards signals not originating in their desired volume of interest and to minimize eddy-currents in the metallic structure of the tool 70, a soft-magnetic material may be positioned on the inside-facing side of the coil 76. The material should provide a high magnetic permeability and low electric conductivity.

Referring to FIG. 4, in one embodiment, in order to increase the magnetic flux flowing through the formation, the magnets 78a and 80a may be coupled by a yoke 88a made from a high magnetic permeability material, such as ferrite or iron, closing the magnetic circuit on the inside of the tool, with leaving a gap only in the area outside the tool. The magnets 78b and 80b may be similarly coupled by a yoke 88b.

FIG. 5 shows the interaction between the magnetic fields generated by the NMR assembly 72a. The coil 76a generates a high frequency oscillating magnetic field $B_1$ and the magnets 78a and 80a create a static magnetic field $B_0$ that is substantially orthogonal to the $B_1$ field in the formation where the NMR measurement is made.

Figure 6:
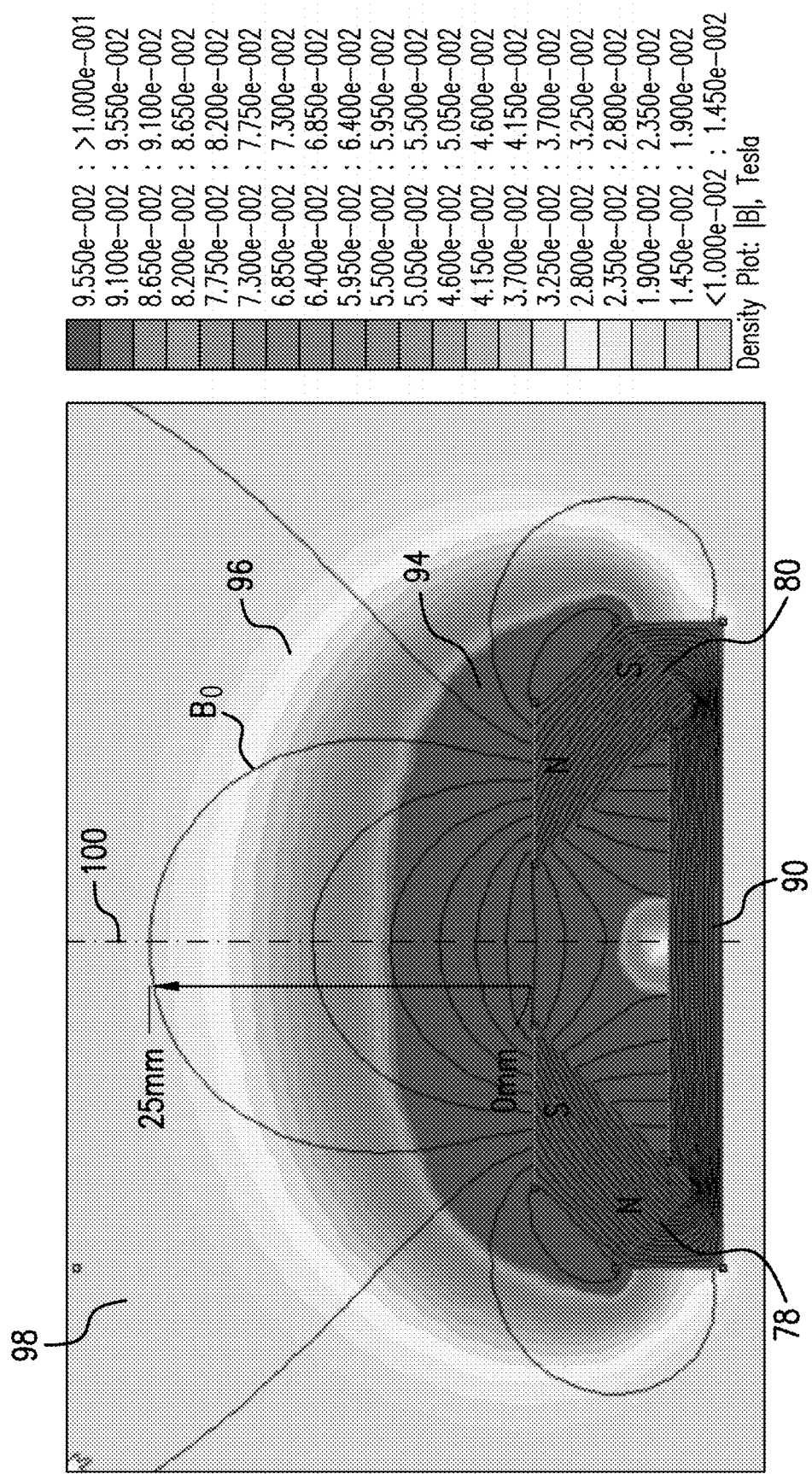
FIG. 6 depicts components of an embodiment of a directionally sensitive NMR assembly including permanent magnets disposed on a yoke made from a high magnetic permeability material, and illustrates a static magnetic field generated by the magnets.
Figure 7:
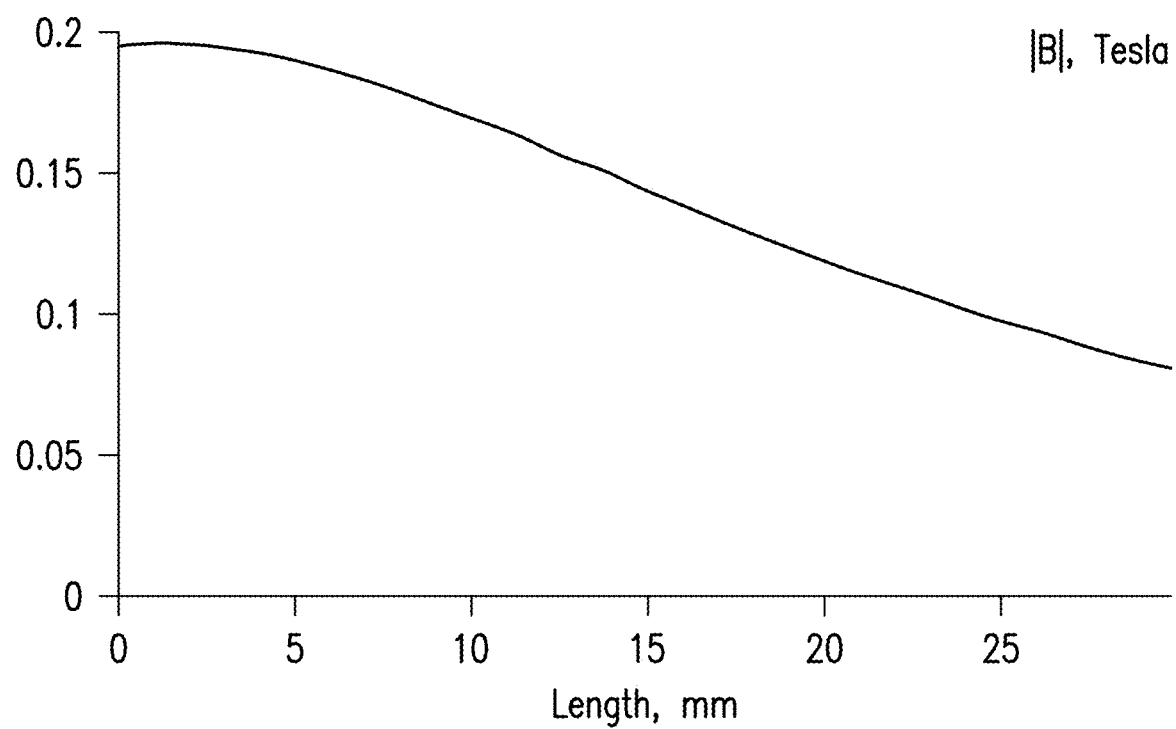
FIG. 7 is a graph showing a strength of the static magnetic field as a function of radial distance from the magnets.
Figure 8:
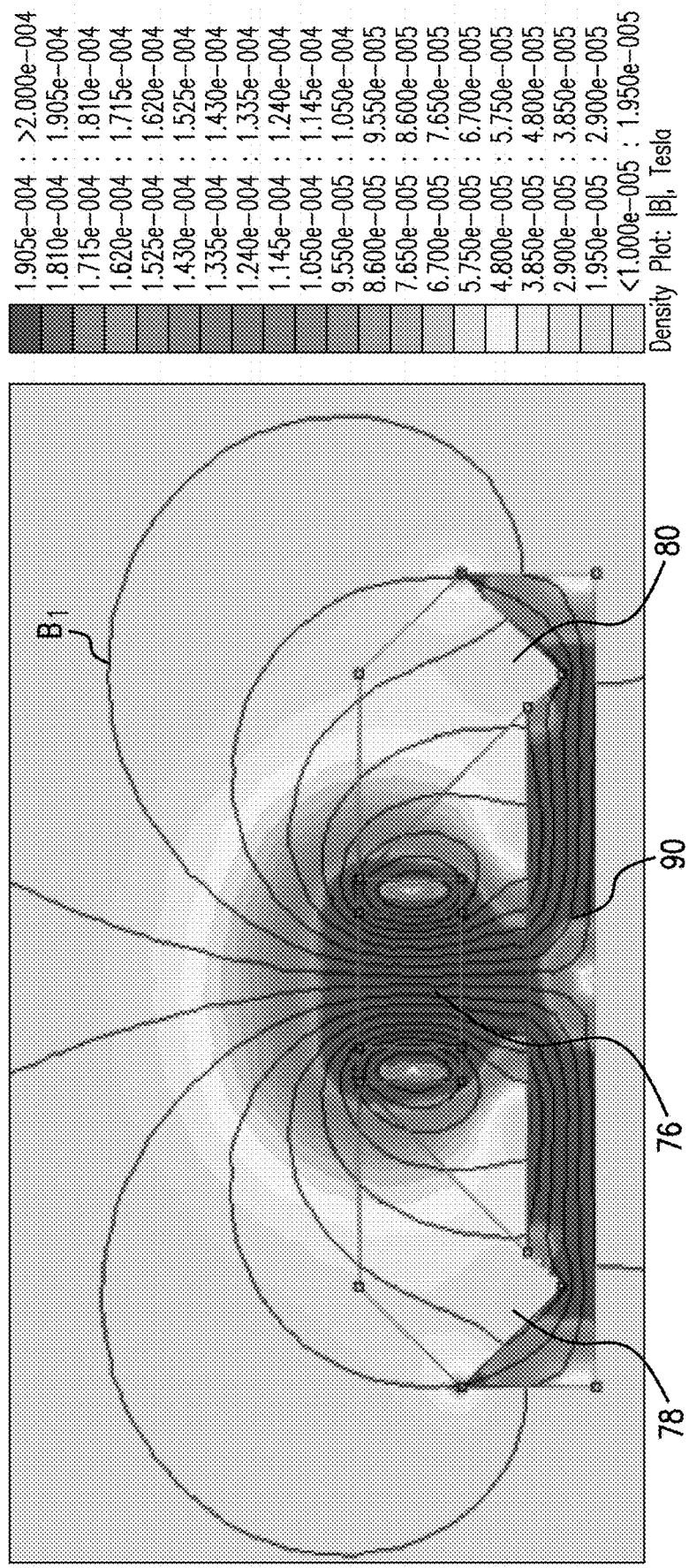
FIG. 8 depicts the NMR assembly of FIG. 6, and illustrates an oscillating magnetic field generated by a coil placed between the permanent magnets.

FIGS. 6-8 depict modeling results of magnetic fields of an embodiment of the NMR assembly 72 including the magnets 78 and 80. In this embodiment, the magnets 78 and 80 are polarized and are oriented towards each other so that their respective axes are approximately at a 45 degree angle relative to a radial axis. In this example, the magnets 78 and 80 are polarized so that the north pole (N) of magnet 80 is facing the south pole (S) of magnet 78. A soft magnetic yoke 90 is disposed between the magnets 78 and 80.

FIG. 6 illustrates the magnets 78 and 80 and a $B_0$ field generated by the magnets 78 and 80, which is represented by field lines representing the magnetic flux. The field lines are representing by curves labeled as $B_0$. As shown, the yoke 90 acts to close the flux. In this example, the volume in the formation having a reasonable high field strength to create a proton NMR frequency of about 4 MHz in a region at a distance from the tool of about 22 mm. At the same time, the gradient in this region should be small enough to include a comparatively large volume with a reasonable bandwidth of the NMR transmitter and receiver.

The magnetic field strength is depicted by a color coding in FIG. 6 and in other figures. As shown, the magnetic field strength is highest in a volume 94 close to the poles of the magnets, i.e., about 1.3 Tesla (T), and falls with increasing distance from the magnets 78 and 80. For example, the field strength in a volume 96 is around about 0.25-0.5 T, and the field strength in a further volume 98 is less than about 0.2 T. This arrangement results in a sufficient field strength of about 0.1 T in a usable distance (i.e., a distance that extends into the formation outside of the borehole 84). As shown in FIG. 6, in this example, a sufficient field strength is achievable at a distance of at least about 25 mm.

FIG. 7 is a graph that shows the flux density of the $B_0$ field of FIG. 6 as a function of radial distance from the magnets 78 and 80 between the magnet poles, where zero is a radial location at the outside diameter of the tool. In one embodiment, the position of the outer face of the magnets 78 and 80 is about the same as the radial position of the outside diameter of the tool. As shown, this arrangement is able to produce a flux density sufficient to produce a usable NMR measurement in a distance on the order of tens of millimeters away from the borehole. For example, a flux density of about 0.1 T can be maintained at a distance of about 22 mm.

FIG. 8 shows an example of the antenna coil 76, which is positioned between the magnets and is oriented in the radial direction. The coil 76 in this example is configured as both a transmitter (TX) antenna and a receiver (RX) antenna, but is not so limited. FIG. 8 also shows the oscillating magnetic field $B_1$ produced with the coil 76 having a 10 amp winding. With this winding, a sufficient field strength in the formation sector (near the intersection of the magnet and coil axes) of about 0.0001 T ($1*10^{-4}$ T) can be achieved, which is about 1/1000 of the $B_0$ field-strength.

Another embodiment of the NMR assembly includes oppositely polarized magnets without a yoke applied to the magnets. The magnets are oriented toward each other by a selected angle, which can range from zero to about 90 degrees. In one embodiment, the magnets are oriented between 40 and 60 degrees. This creates a saddle-point in the field distribution, which creates an area with low magnetic field gradients in a region far from the tool.

Figure 9:
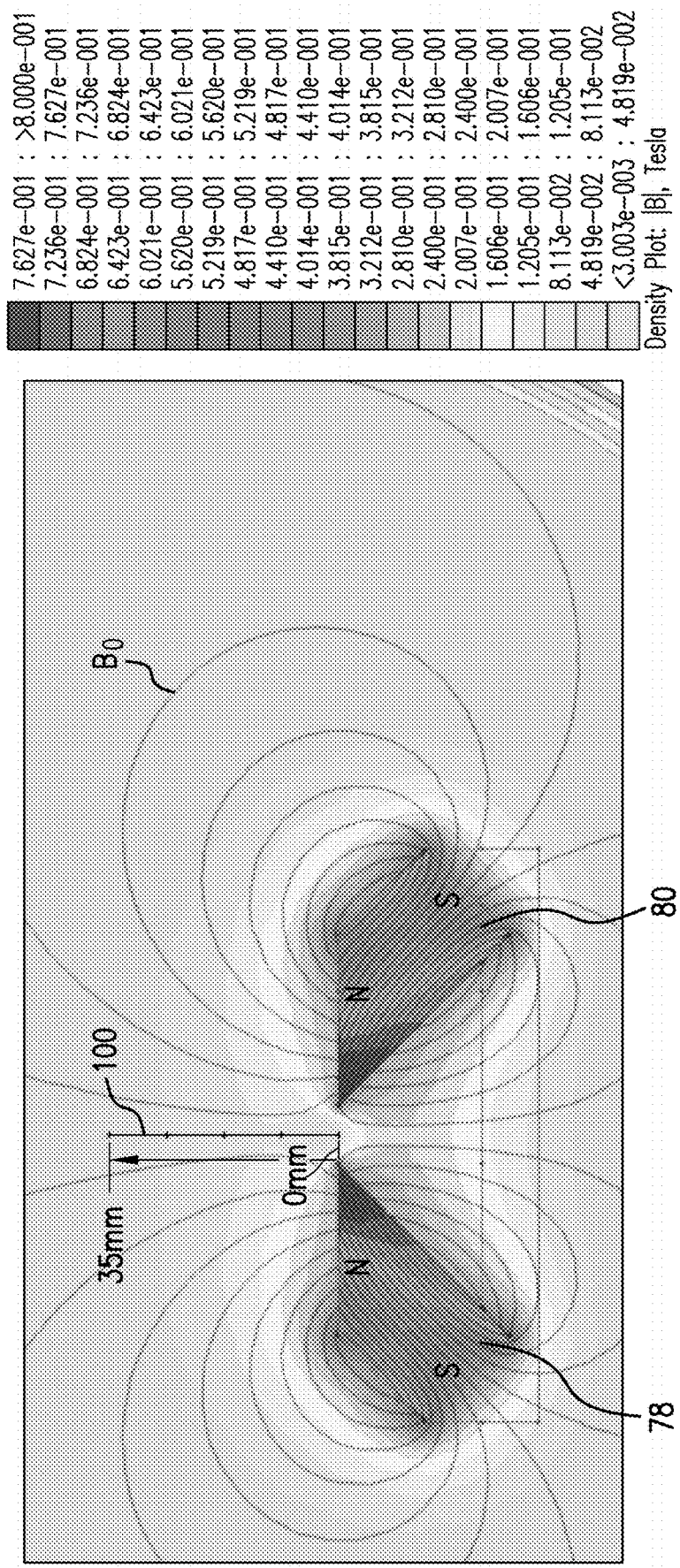
FIG. 9 depicts components of an embodiment of a directionally sensitive NMR assembly including opposing permanent magnets, and illustrates a static magnetic field generated by the magnets.

Referring to FIG. 9, the magnets 78 and 80 are oriented at about 45 degrees and the N-poles are closer together (in the direction of the axis L) than the magnets in the embodiment of FIGS. 6-8. The magnetic field $B_0$ produced by the magnets is shown by field lines and a color coding to indicate field strength. As shown, a sufficient field strength is achievable at a distance of at least about 35 mm.

The axial distance between the magnets 78 and 80 may be varied to change the flux density at a given radial distance. Generally, as the magnets 78 and 80 get closer together, the flux density increases and the potential measurement zone gets closer to the tool 70 and to the borehole wall. Thus, the distance between the magnets 78 and 80 should be large enough so that the measurement zone is located in a formation sector outside of the borehole 84.

Figure 10:
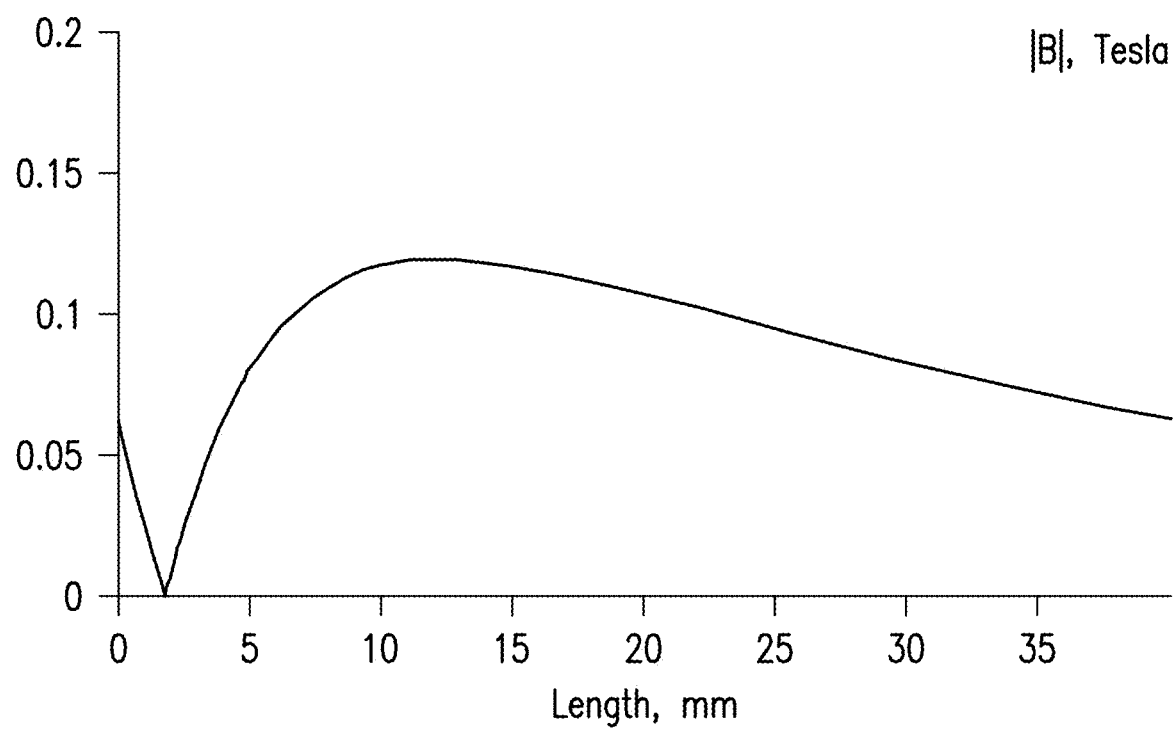
FIG. 10 is a graph showing a strength of the static magnetic field of FIG. 9 as a function of radial distance from the magnets.

FIG. 10 shows the $B_0$ magnetic flux density in the radial direction along the vertical radial line 100 shown in FIG. 9. As shown, the field strength (flux density) has a saddle point about 12 mm from the north faces of the magnets. This saddle point may be at any suitable distance. For example, the saddle point may be located at least behind the borehole wall inside the formation, e.g., if the NMR sensor is placed on a stabilizer-rib or other structure that can touch the borehole wall. The region of the saddle point has a field strength between about 0.1 and 0.15 T in this example, a sufficient field strength is achievable at a distance of about 35 mm.

Figure 11:
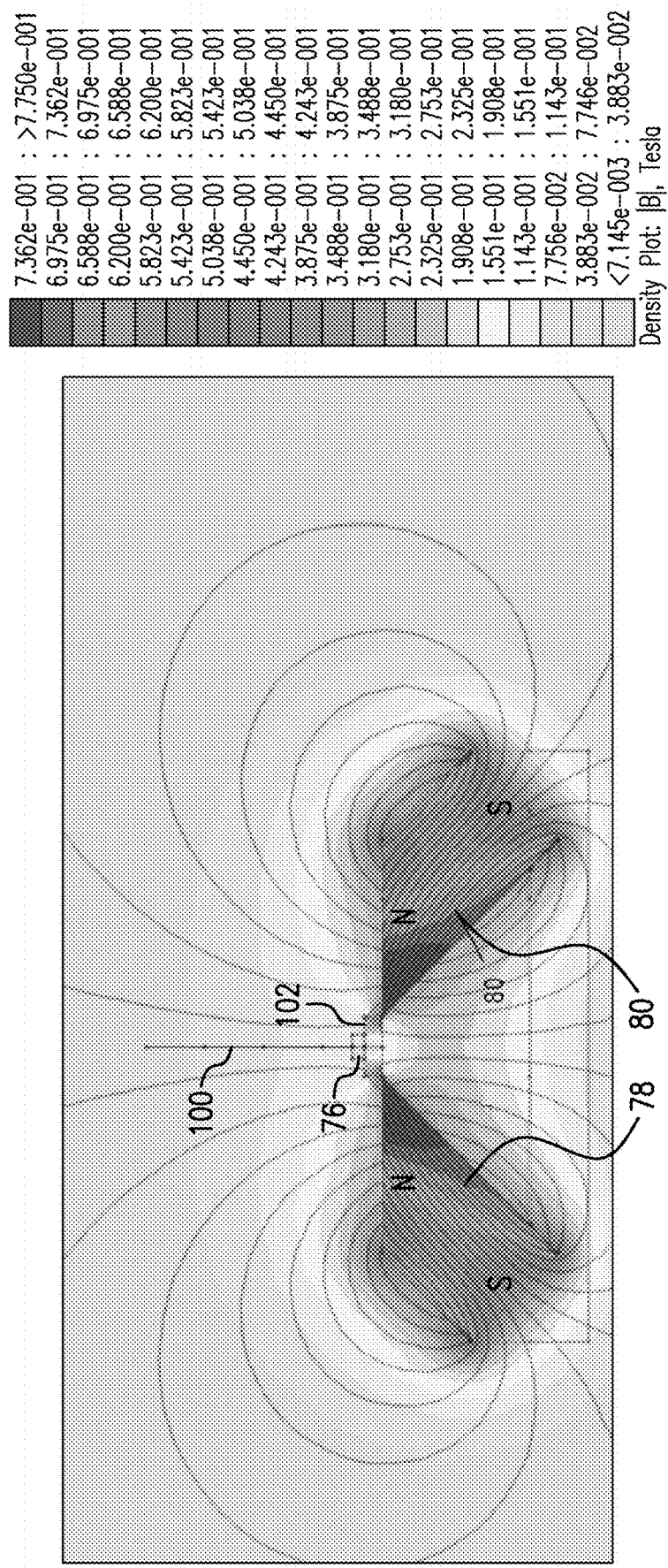
FIG. 11 depicts the NMR assembly of FIG. 9, and shows an antenna coil placed between the permanent magnets and the effect of a central coil disposed on a soft magnetic ferrite on the static magnetic field.

FIG. 11 shows an embodiment that includes the coil 76 (10 amp*winding) positioned between the magnets 78 and 80. In this embodiment, the coil 76 is disposed on a soft magnetic ferrite 102 that is also positioned between the magnets 78 and 80.

Figure 12:
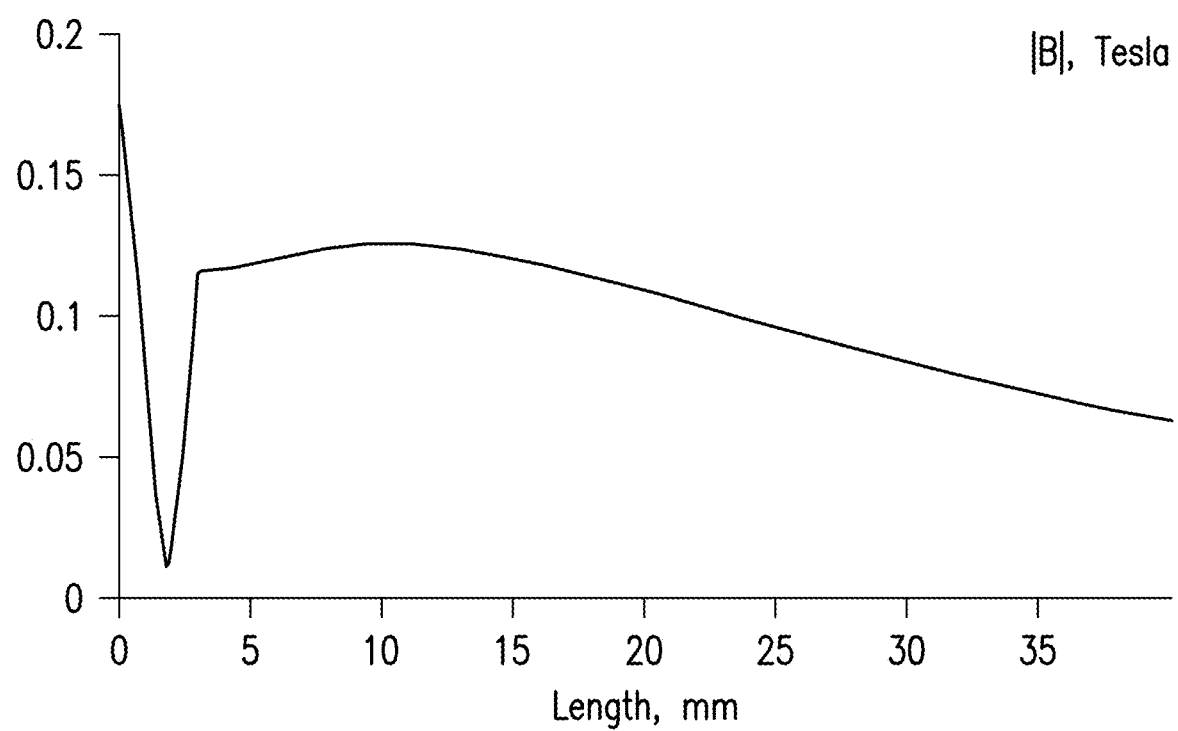
FIG. 12 is a graph showing a strength of the static magnetic field of FIG. 11 as a function of radial distance from the permanent magnets.

FIG. 12 illustrates the effect of having the soft magnetic ferrite 102 on the $B_0$ field. As shown, the $B_0$ field has the saddle point (a region of minimal field-gradient) at about the same distance as FIG. 9.

Figure 13:
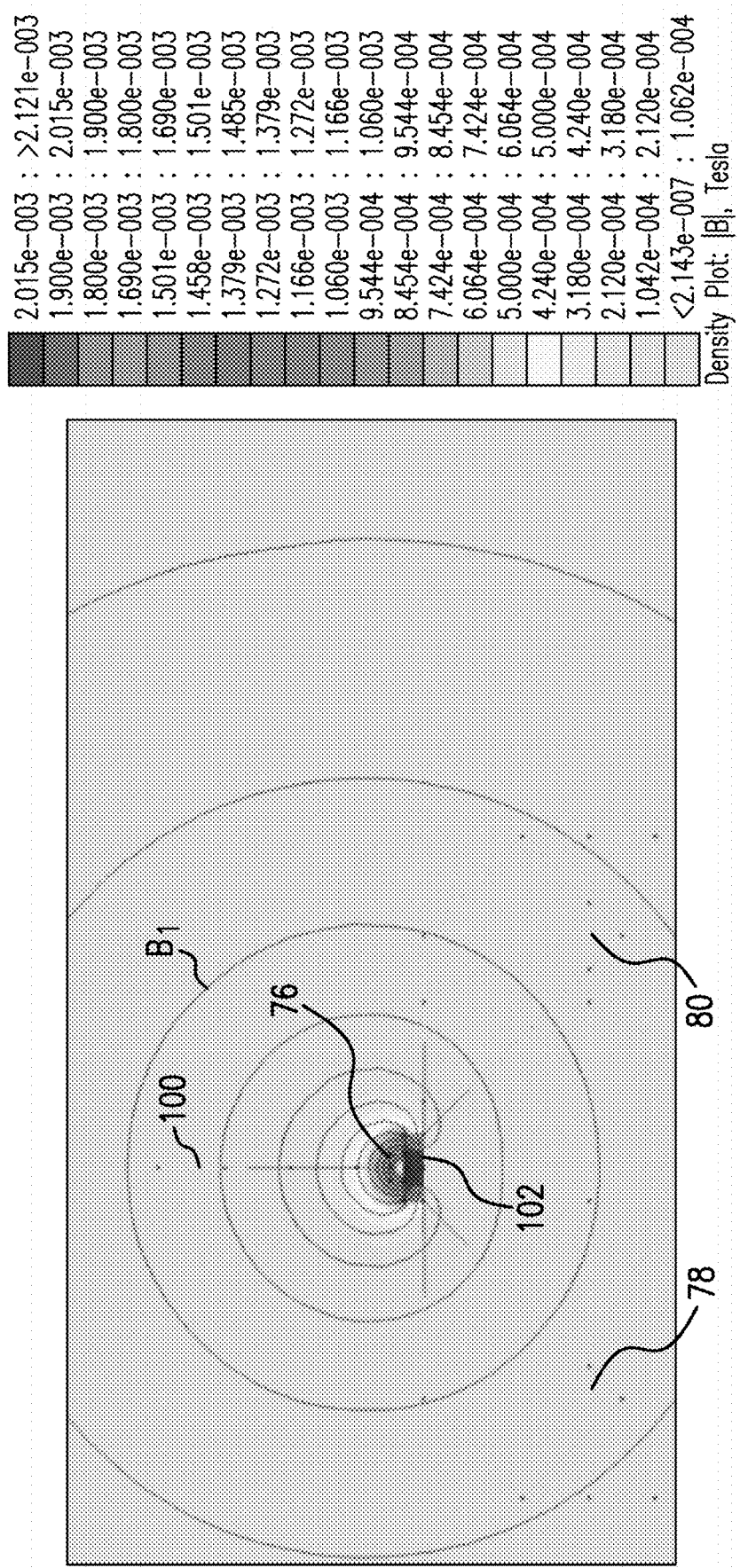
FIG. 13 depicts the NMR assembly of FIGS. 9 and 11, and shows an oscillating magnetic field generated by the central coil.
Figure 14:
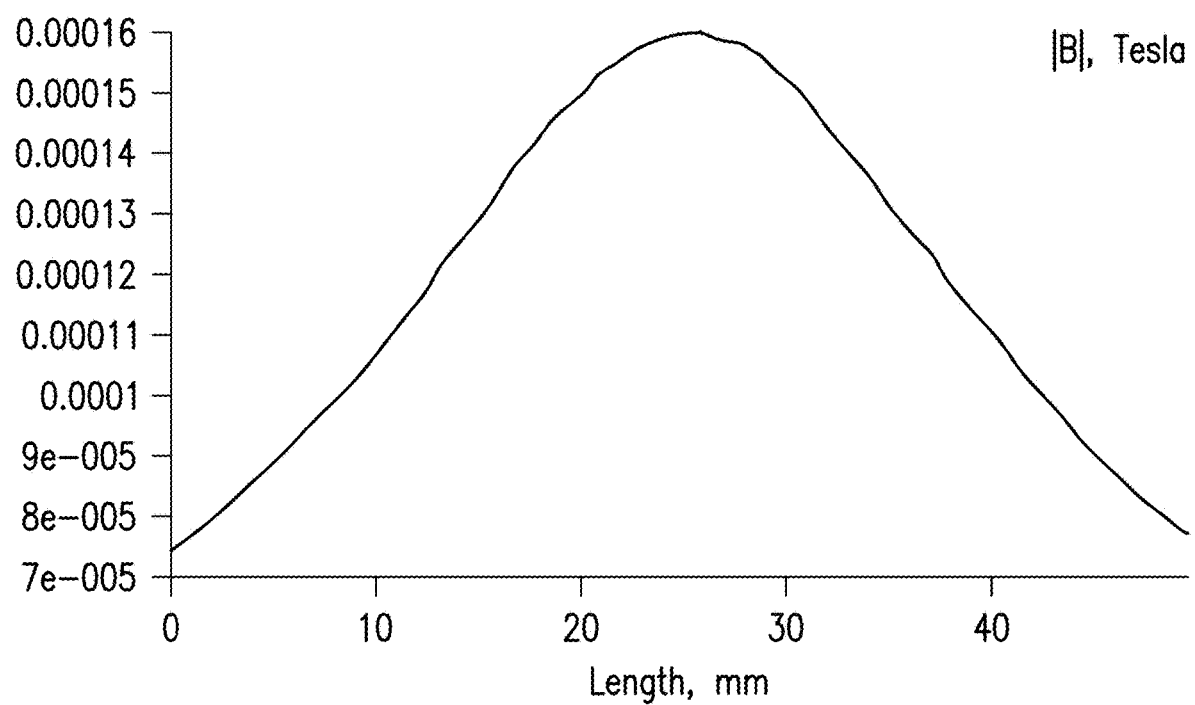
FIG. 14 is a graph showing a strength of the oscillating magnetic field of FIG. 13 at a radial distance from a borehole wall.

The $B_1$ field in this embodiment is shown in FIG. 13, which is substantially orthogonal to the $B_0$ along a radial line 100. FIG. 14 shows the $B_1$ flux density 20 mm from the borehole wall along a direction parallel to the tool 70 (parallel to the axis L). The flux density along this direction is at a maximum between the axial locations of the magnets 78 and 80.

Figure 15:
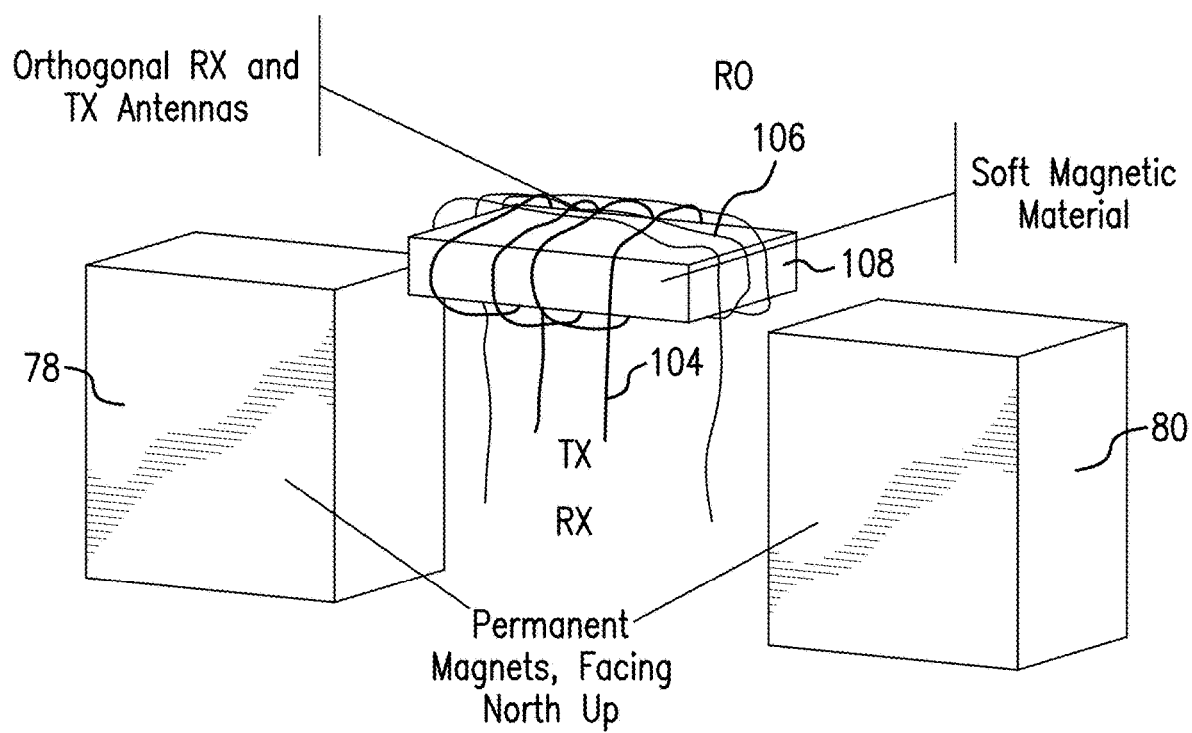
FIG. 15 depicts an embodiment of a directionally sensitive NMR assembly including orthogonal transmitter and receiver coils, and permanent magnets at opposing sides of the coils, the permanent magnets oriented in a radial direction.

FIGS. 15-19 show an embodiment of the NMR assembly 40 that includes two permanent magnets with two coils therebetween. In this embodiment, the magnets 78 and 80 have the same orientation, e.g., the north pole of both magnets faces away from the NMR assembly 72 and toward a formation region. The assembly 72 also includes two orthogonal coils 104 and 106 wrapped around a soft magnetic material 108. One of the coils may be the transmitter antenna (TX) while the other one of the coils may be the receiver antenna (RX). In FIG. 15, the first coil 104 is a transmitter coil (TX) and the second coil 106 is a receiver coil (RX). Alternatively, the first coil 104 may be the RX coil and the second coil 106 may be the TX coil. By positioning the coils orthogonally, the $B_1$ field emitted by the TX coil 104 is decoupled from the $B_1$ field received by the RX coil 106.

Figure 16:
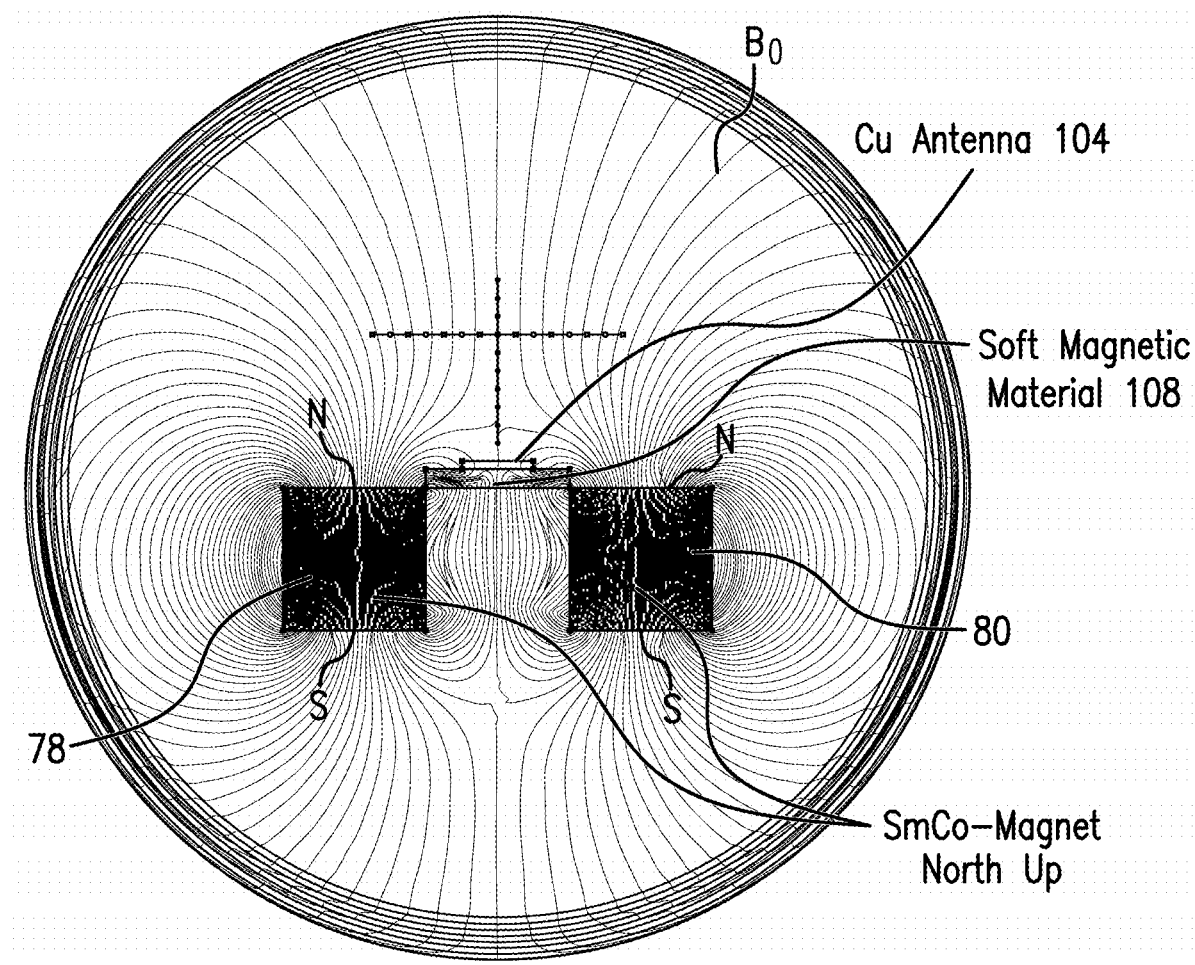
FIG. 16 depicts the NMR assembly of FIG. 15, and illustrates a static magnetic field generated by the magnets.
Figure 17:
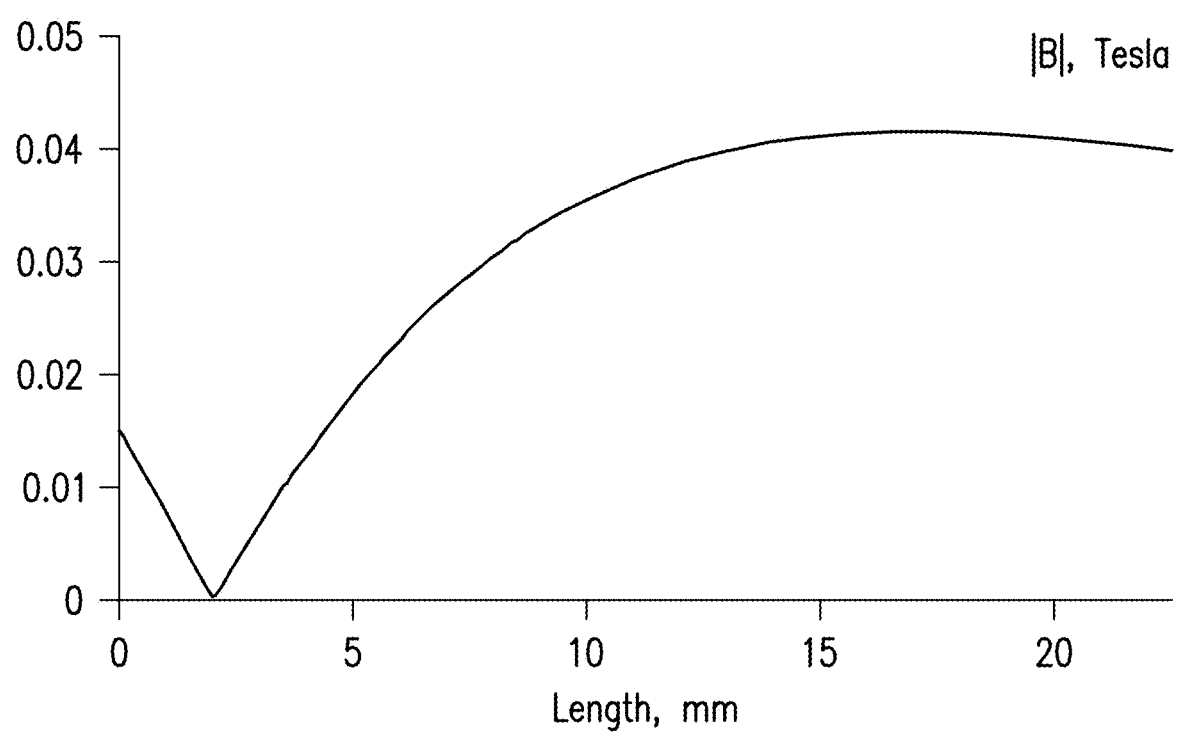
FIG. 17 is a graph showing a strength of the static magnetic field of FIG. 16 as a function of radial distance from the permanent magnets.

FIG. 16 shows Finite Element Modelling of the $B_0$ field generated by the magnets 78 and 80, and FIG. 17 shows the B0 field strength in the radial direction along a line 109 shown in FIG. 16. As shown, this arrangement is able to produce a $B_0$ field that has a saddle point between 15 and 20 mm from the outside dimension of the tool (and the borehole wall if the tool is placed against the borehole wall).

Figure 18:
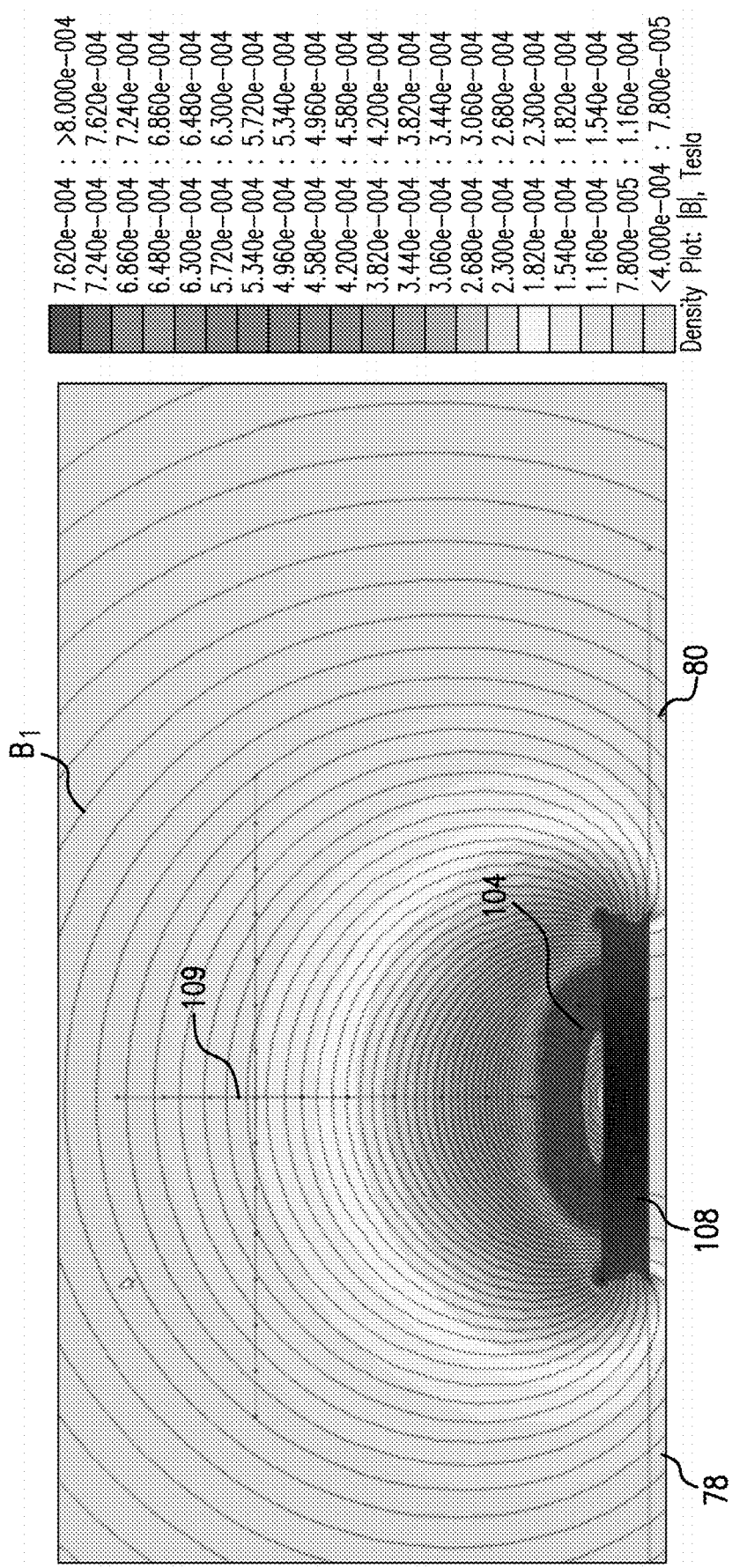
FIG. 18 depicts the NMR assembly of FIGS. 15 and 16, and illustrates an oscillating magnetic field generated by the transmitter coil.
Figure 19:
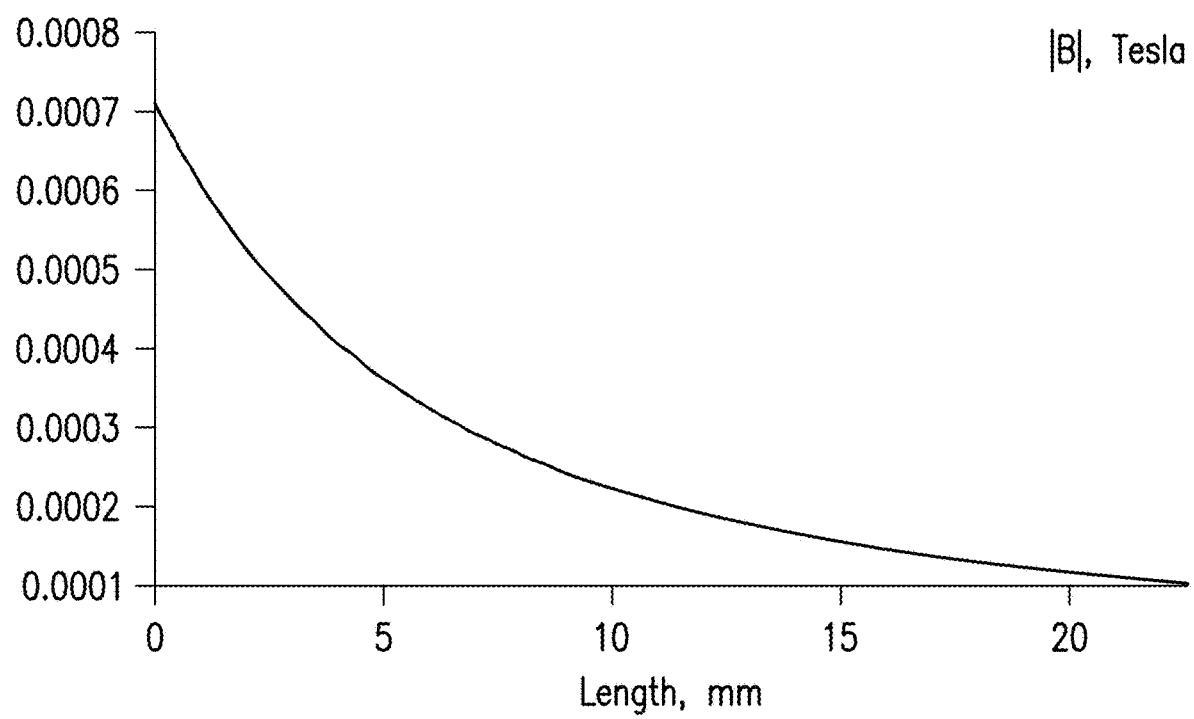
FIG. 19 is a graph showing a strength of the oscillating magnetic field of FIG. 18 as a function of radial distance from the antenna coil.

FIG. 18 shows the $B_1$ field distribution generated by the Tx coil 104, and FIG. 19 shows the $B_1$ field strength along the radial line 109, where zero is at the outside dimension of the tool and/or the borehole wall.

FIGS. 20-23 show another configuration of the NMR assembly 70, which includes a permanent magnet 110 centrally located between opposing coils 112 and 114. The coils 112 and 114 may be configured as both transmitters and receivers. Alternatively, the coils 112 and 114 may be transmitters, and the NMR assembly 70 can include another set of opposing coils such that the TX and the RX fields decouple orthogonally (not shown) as receivers. For example, in FIG. 20, the magnet 110 is oriented along a radial axis R, and the coils 112 and 114 are arrayed along a longitudinal axis L perpendicular to the R axis. A pair of receiver coils may be disposed on each side of the magnet 110 and arrayed along an axis Z that is perpendicular to both the L axis and the R axis. In this configuration, the transmitting coils 112 and 114 are at least substantially inductively decoupled from the receiver coils.

Figure 20:
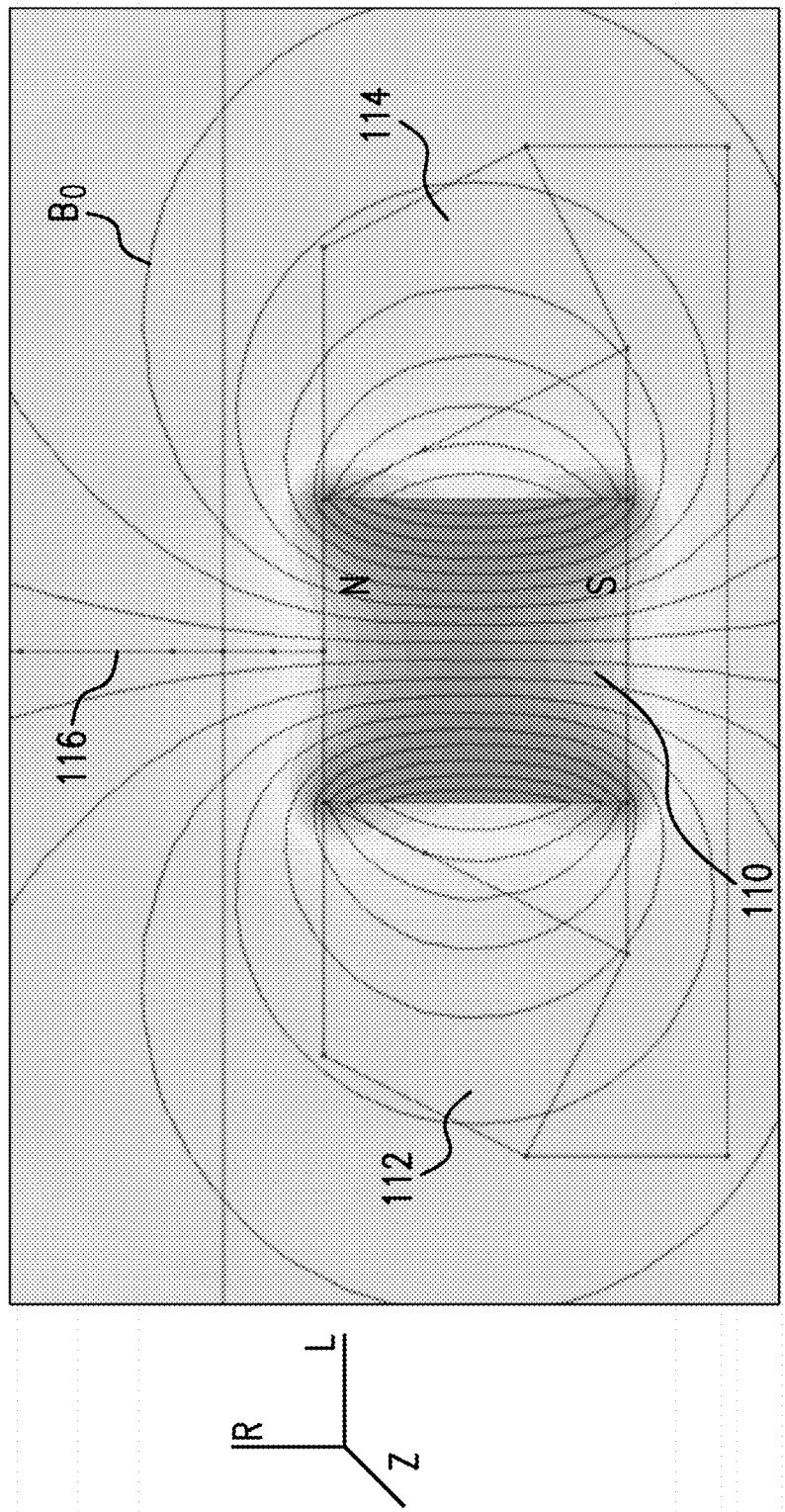
FIG. 20 depicts an embodiment of a directionally sensitive NMR assembly including a central permanent magnet and coils disposed at opposing sides of the central magnet, and illustrates a static magnetic field generated by the magnet.
Figure 21:
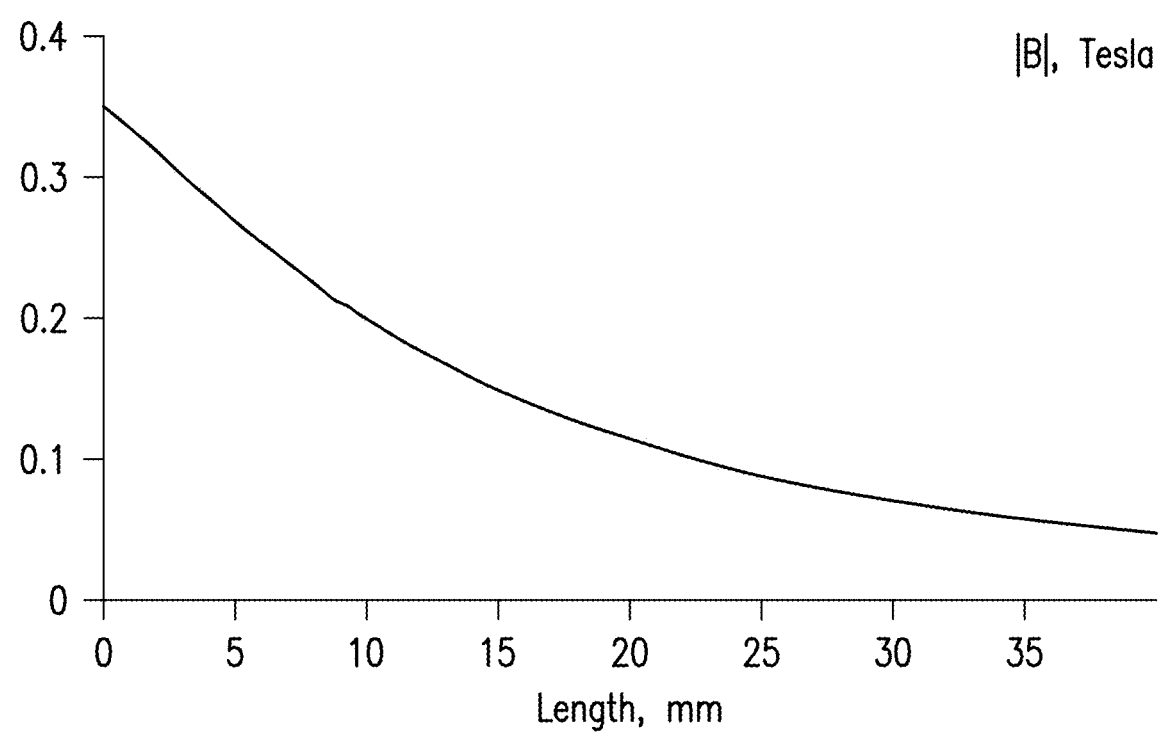
FIG. 21 is a graph showing a strength of the static magnetic field of FIG. 20 as a function of radial distance from the permanent magnet.

FIG. 20 shows a static magnetic field $B_0$ generated by the permanent magnet 110. FIG. 21 shows the $B_0$ field strength as a function of radial distance away from the magnet 110. The radial distance is represented by a line 116 of FIG. 20. A shown in FIG. 21, a field strength of about 0.1 T is achievable between about 20 and 25 mm from the tool or the borehole wall.

Figure 22:
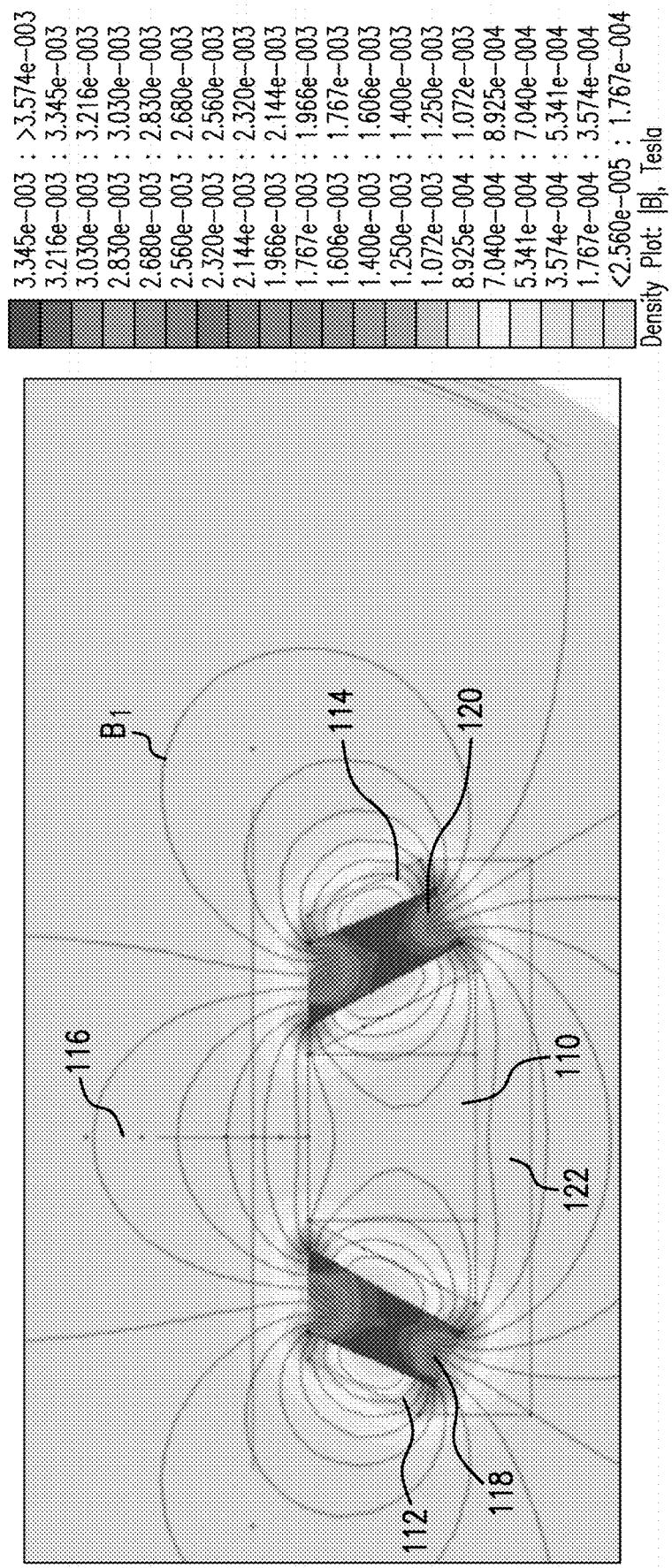
FIG. 22 depicts the NMR assembly of FIG. 20, and illustrates an oscillating magnetic field generated by the coils.

Referring to FIG. 22, shows the $B_1$ field of the arrangement of FIG. 20. The coils 112 and 114 are wrapped around two cylindrical soft magnetic ferrites 118 and 120 that are connected by a soft-magnetic yoke 122. The coils are oriented toward each other by a selected angle, which can range from zero to about 90 degrees.

Figure 23:
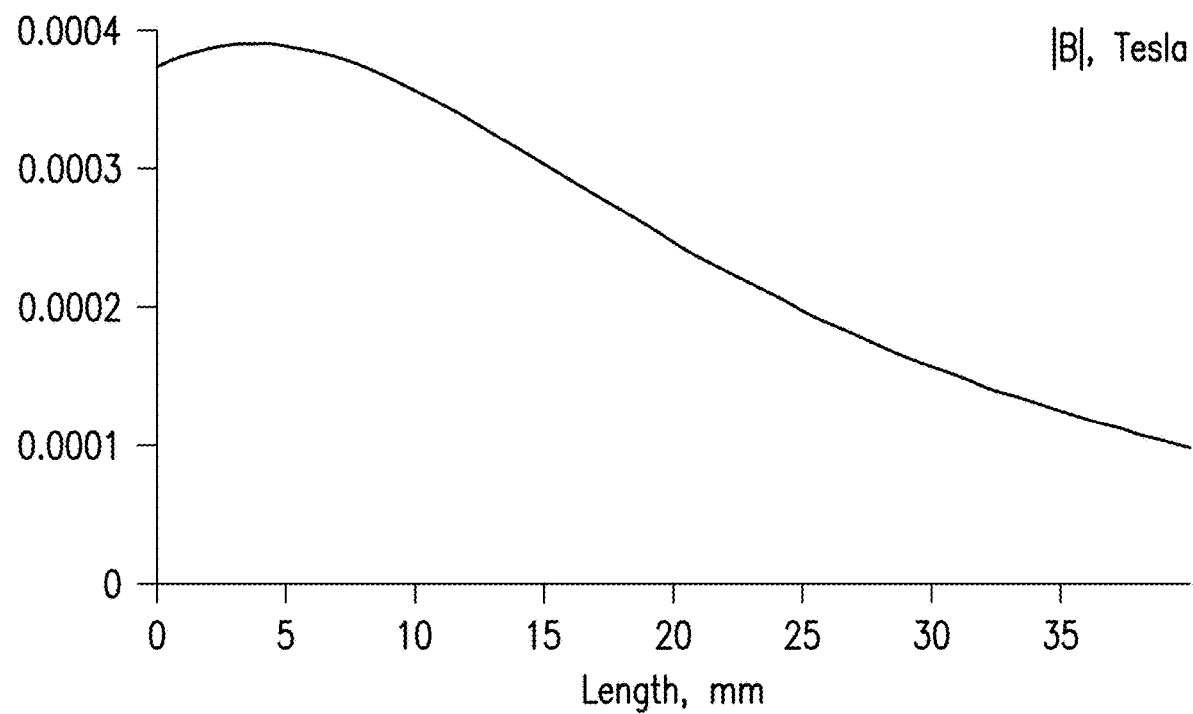
FIG. 23 is a graph showing a strength of the oscillating magnetic field of FIG. 22 as a function of radial distance from the permanent magnet.

FIG. 22 shows an oscillating magnetic field $B_1$ generated by the coils 112 and 114. FIG. 23 shows the $B_1$ field strength as a function of radial distance away from the antenna coils 112 and 114 (where zero is the outside dimension of the tool and/or the borehole wall). As noted above, the radial distance in this embodiment is represented by the line 116.

Figure 24:
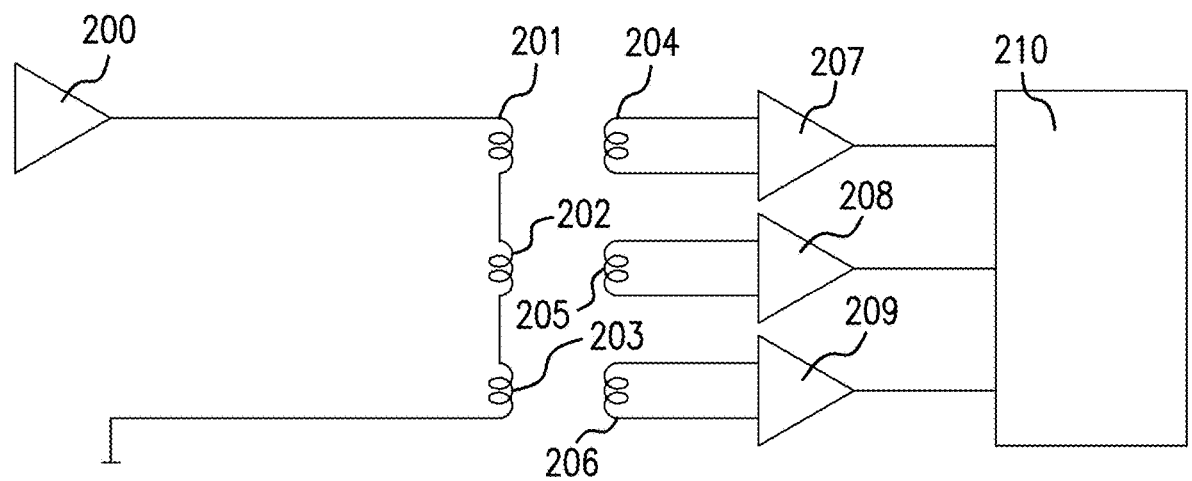
FIG. 24 depicts an embodiment of electronic circuitry of an NMR measurement system.

FIG. 24 depicts an embodiment of electronic circuitry of the disclosed NMR measurement system. The circuitry includes or is connected to one or more transmitter coils. For example, the circuitry includes transmitter coils 201, 202 and 203, which are driven by a single electronics module, such as a TX amplifier 200, and create three oscillating $B_1$ fields in three separate regions in a formation surrounding a tool. The transmitter coils may be one or more of the coils (e.g., coils 76, coils 76a and/or coils 76b) included in various embodiments described herein.

Receiver coils 204, 205 and 206 may be connected to individual processing modules, or all of the coils may be connected to a single processing module, e.g., via a multiplexer. In this example, the receiver coils 204, 205 and 206 are connected individually to respective receiver-amplifiers 207, 208 and 209, to receive and amplify the spin echoes created in the separate regions in the formation. A processing unit 210 derives a parameter of interest from the formation, such as one or more of porosity, permeability, gas-saturation, water-saturation, oil-saturation, production rate, fluid flow velocity and the like.

Figure 25:
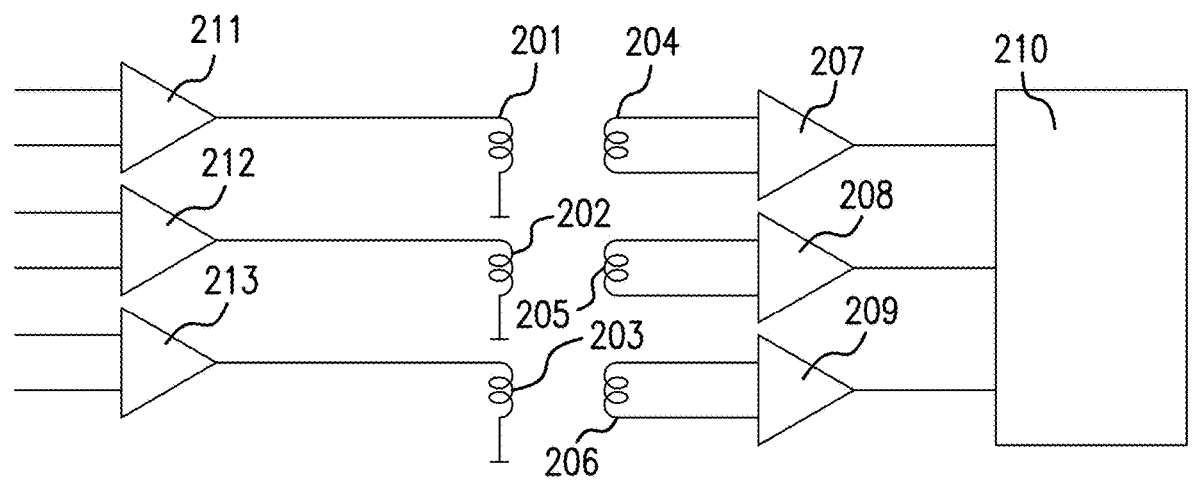
FIG. 25 depicts an embodiment of electronic circuitry of an NMR measurement system.

FIG. 25 depicts another embodiment of electronic circuitry of the disclosed NMR measurement system. In this embodiment, the transmitter coils 201, 202 and 203 are driven by individual TX amplifier electronics modules 211, 212 and 213, and create three oscillating B1 fields in three separate regions in the formation surrounding the tool. Receiver coils 204, 205 and 206 are connected individually to respective receiver-amplifiers 207, 208 and 209 to receive and amplify the spin echoes created in the separate regions in the formation. The processing unit 210 derives a parameter of interest from the formation, such as one or more of porosity, permeability, gas-saturation, water-saturation, oil-saturation, production rate, fluid flow velocity and the like.

Set forth below are some embodiments of the foregoing disclosure:

Embodiment 1: A system for acquiring directional information about a geologic formation, comprising: at least one directionally sensitive nuclear magnetic resonance (NMR) assembly disposed at a borehole string including the downhole component, the borehole string configured to be deployed in a borehole in an earth formation, the at least one NMR assembly including at least one magnet configured to generate a static magnetic field and at least one coil configured to generate an oscillating magnetic field, the at least one NMR assembly configured to perform an NMR measurement of at least one sector of a formation region; and a processing device configured to receive NMR measurement data from the at least one NMR assembly, the processing device configured to perform: analyzing the NMR measurement data to estimate a parameter of the sector; determining a direction of the downhole component based on the estimated parameter; and steering the downhole component according to the determined direction.

Embodiment 2: The system as in any prior embodiment, wherein the parameter is selected from at least one of porosity, saturation and permeability.

Embodiment 3: The system as in any prior embodiment, wherein the at least one NMR assembly is disposed at one or more axial locations and at one or more angular locations.

Embodiment 4: The system as in any prior embodiment, wherein the at least one magnet includes at least one permanent magnet.

Embodiment 5: The system as in any prior embodiment, wherein the at least one NMR assembly is configured to perform a first NMR measurement of a first sector of the formation region around the borehole, and to perform a second NMR measurement of a second sector of the formation region, the processing device is configured to estimate a difference in the parameter between the first sector and the second sector, and controlling the direction is based on the difference in the parameter.

Embodiment 6: The system as in any prior embodiment, wherein the first sector is located at a first azimuthal direction and the second sector is located at a second azimuthal direction.

Embodiment 7: The system as in any prior embodiment, wherein the NMR measurement assembly is disposed at the downhole component such that a face of the at least one magnet is located proximate to a borehole wall.

Embodiment 8: The system as in any prior embodiment, wherein the at least one NMR assembly is disposed on a rotating component of the borehole string, is configured to perform the first NMR measurement when the NMR assembly is at a first angular location, and is configured to perform the second NMR measurement when the NMR assembly is at a second angular location.

Embodiment 9: The system as in any prior embodiment, wherein the at least one NMR assembly includes a plurality of NMR assemblies disposed at a selected axial location of the borehole string, the plurality of NMR assemblies located at different angular locations relative to a longitudinal axis of the borehole string at the selected axial location.

Embodiment 10: The system as in any prior embodiment, wherein each of the plurality of NMR assemblies includes a receiver coil, and each receiver coil is connected to a respective processing module or all of the receiver coils are connected to a single processing module.

Embodiment 11: The system as in any prior embodiment, wherein each of the plurality of NMR assemblies includes a transmitter coil, and each transmitter coil is driven by a respective electronics module or all of the transmitter coils are driven by a single electronics module.

Embodiment 12: The system as in any prior embodiment, wherein the at least one magnet and the at least one coil are oriented at least partially in a radial direction, the at least one magnet having an axis in a direction of polarity of the at least one magnet, the at least one coil having a central axis surrounded by windings of the coil, and the axis of the at least one magnet and the central axis of the at least one coil intersect at a location within the sector and outside of a borehole wall.

Embodiment 13: The system as in any prior embodiment, wherein the at least one coil includes a first coil and a second coil, the at least one magnet is a radially oriented magnet centrally located between the first coil and the second coil, the first coil and the second coil oriented toward each other by an angle between zero degrees and 90 degrees.

Embodiment 14: The system as in any prior embodiment, wherein the at least one magnet includes a first magnet and a second magnet oriented in a radial direction, the at least one coil located between the first magnet and the second magnet, the at least one coil including a transmitter coil and a receiver coil, the transmitter coil oriented orthogonally with respect to the receiver coil.

Embodiment 15: A method of acquiring directional information about a geologic formation, comprising: deploying a tool as part of a borehole string in a borehole in an earth formation, the tool including at least one directionally sensitive nuclear magnetic resonance (NMR) assembly, the at least one NMR assembly including at least one magnet configured to generate a static magnetic field and at least one coil configured to generate an oscillating magnetic field; performing an NMR measurement of at least one sector of a formation region by the at least one NMR assembly, the NMR measurement generating NMR measurement data; analyzing the NMR measurement data to estimate a parameter of the at least one sector; and determining a direction of the downhole component based on the estimated parameter; and steering the downhole component according to the determined direction.

Embodiment 16: The method as in any prior embodiment, wherein performing the NMR measurement includes performing a first NMR measurement of a first sector of the formation region around the borehole, and performing a second NMR measurement of a second sector of the formation region, estimating the parameter includes estimating a difference in the parameter between the first sector and the second sector, and controlling the direction is based on the difference in the parameter.

Embodiment 17: The method as in any prior embodiment, wherein the downhole component is configured to be deployed within a target formation layer having a target parameter value, the target formation layer adjacent to a second formation layer having a parameter value that is different than the target parameter value, and controlling the direction includes steering the downhole component based on the difference to maintain the downhole component in the target formation layer.

Embodiment 18: The method as in any prior embodiment, wherein controlling the direction includes determining that the downhole component is in a transition region between the target formation layer and the second formation layer based on the difference, identifying a sector having a parameter value that corresponds to the target formation layer, and steering the downhole component in a direction of the identified sector.

Embodiment 19: The method as in any prior embodiment, wherein the at least one NMR assembly includes a plurality of NMR assemblies disposed at a selected axial location of the borehole string, the plurality of NMR assemblies located at different angular locations relative to a longitudinal axis of the borehole string at the selected axial location.

Embodiment 20: The method as in any prior embodiment, wherein each of the plurality of NMR assemblies includes a transmitter coil and a receiver coil, each receiver coil is connected to a respective processing module or all of the receiver coils are connected to a single processing module, and each transmitter coil is driven by a respective electronics module or all of the transmitter coils are driven by a single electronics module.

In connection with the teachings herein, various analyses and/or analytical components may be used, including digital and/or analog subsystems. The system may have components such as a processor, storage media, memory, input, output, communications link (wired, wireless, pulsed mud, optical or other), user interfaces, software programs, signal processors and other such components (such as resistors, capacitors, inductors, etc.) to provide for operation and analyses of the apparatus and methods disclosed herein in any of several manners well-appreciated in the art. It is considered that these teachings may be, but need not be, implemented in conjunction with a set of computer executable instructions stored on a computer readable medium, including memory (ROMs, RAMs), optical (CD-ROMs), or magnetic (disks, hard drives), or any other type that when executed causes a computer to implement the method of the present invention. These instructions may provide for equipment operation, control, data collection and analysis and other functions deemed relevant by a system designer, owner, user, or other such personnel, in addition to the functions described in this disclosure.

One skilled in the art will recognize that the various components or technologies may provide certain necessary or beneficial functionality or features. Accordingly, these functions and features as may be needed in support of the appended claims and variations thereof, are recognized as being inherently included as a part of the teachings herein and a part of the invention disclosed.

While the invention has been described with reference to exemplary embodiments, it will be understood by those skilled in the art that various changes may be made and equivalents may be substituted for elements thereof without departing from the scope of the invention. In addition, many modifications will be appreciated by those skilled in the art to adapt a particular instrument, situation or material to the teachings of the invention without departing from the essential scope thereof. Therefore, it is intended that the invention not be limited to the particular embodiment disclosed as the best mode contemplated for carrying out this invention.

What is claimed is:

1. A system for acquiring directional information about a geologic formation, comprising:

at least one directionally sensitive nuclear magnetic resonance (NMR) assembly disposed at a borehole string including a downhole component, the borehole string configured to be deployed in a borehole in an earth formation, the at least one NMR assembly including at least one magnet configured to generate a static magnetic field and at least one coil configured to generate an oscillating magnetic field, the at least one NMR assembly configured to perform an NMR measurement of at least one sector of a formation region; and a processing device configured to receive NMR measurement data from the at least one NMR assembly, the processing device configured to perform:

analyzing the NMR measurement data to estimate a parameter of the at least one sector;

determining a direction of the downhole component based on the estimated parameter; and steering the downhole component according to the determined direction.

2. The system of claim 1, wherein the estimated parameter is selected from at least one of porosity, saturation and permeability.

3. The system of claim 1, wherein the at least one NMR assembly is disposed at one or more axial locations and at one or more angular locations.

4. The system of claim 1, wherein the at least one magnet includes at least one permanent magnet.

5. The system of claim 1, wherein the NMR measurement performed by the at least one NMR assembly includes a first NMR measurement of a first sector of the formation region around the borehole providing a first estimated parameter, and a second NMR measurement of a second sector of the formation region providing a second estimated parameter, the processing device is configured to estimate a difference between the first estimated parameter and the second estimated parameter, and steering the downhole component is based on the difference between the first estimated parameter and the second estimated parameter.

6. The system of claim 5, wherein the first sector is located at a first angular position relative to the borehole, and the second sector is located at a second angular position relative to the borehole.

7. The system of claim 1, wherein the at least one NMR assembly is disposed at the downhole component such that a face of the at least one magnet is located proximate to a borehole wall.

8. The system of claim 5, wherein the at least one NMR assembly is disposed on a rotating component of the borehole string, the at least one NMR assembly is configured to perform the first NMR measurement when the at least one NMR assembly is at a first angular location, and the at least one NMR assembly is configured to perform the second NMR measurement when the at least one NMR assembly is at a second angular location.

9. The system of claim 1, wherein the at least one NMR assembly includes a plurality of NMR assemblies disposed at a selected axial location relative to a longitudinal axis of the borehole string, the plurality of NMR assemblies located at different angular locations relative to the longitudinal axis of the borehole string at the selected axial location.

10. The system of claim 9, wherein each of the plurality of NMR assemblies includes a receiver coil, and each receiver coil is connected to a respective processing module or all of the receiver coils are connected to a single processing module.

11. The system of claim 9, wherein each of the plurality of NMR assemblies includes a transmitter coil, and each transmitter coil is driven by a respective electronics module or all of the transmitter coils are driven by a single electronics module.

12. The system of claim 1, wherein the at least one magnet and the at least one coil are oriented at least partially in a radial direction, the at least one magnet having an axis in a direction of polarity of the at least one magnet, the at least one coil having a central axis surrounded by windings of the at least one coil, and the axis in the direction of polarity of the at least one magnet and the central axis of the at least one coil intersect at a location within the at least one sector and outside of a borehole wall.

13. The system of claim 12, wherein the at least one coil includes a first coil and a second coil, the at least one magnet is a radially oriented magnet centrally located between the first coil and the second coil, the first coil and the second coil oriented toward each other by an angle between zero degrees and 90 degrees.

14. The system of claim 1, wherein the at least one magnet includes a first magnet and a second magnet oriented in a radial direction, the at least one coil located between the first magnet and the second magnet, the at least one coil including a transmitter coil and a receiver coil, the transmitter coil oriented orthogonally with respect to the receiver coil.

15. A method of acquiring directional information about a geologic formation, comprising:
   deploying a downhole component as part of a borehole string in a borehole in an earth formation, the downhole component including at least one directionally sensitive nuclear magnetic resonance (NMR) assembly, the at least one NMR assembly including at least one magnet configured to generate a static magnetic field and at least one coil configured to generate an oscillating magnetic field;
   performing an NMR measurement of at least one sector of a formation region by the at least one NMR assembly, the NMR measurement generating NMR measurement data;
   analyzing the NMR measurement data to estimate a parameter of the at least one sector;
   determining a direction of the downhole component based on the estimated parameter; and
   steering the downhole component according to the determined direction.

16. The method of claim 15, wherein performing the NMR measurement includes performing a first NMR measurement of a first sector of the formation region around the borehole providing a first estimated parameter, performing a second NMR measurement of a second sector of the formation region providing a second estimated parameter, estimating the parameter includes estimating a difference between the first estimated parameter and the second estimated parameter, and steering the downhole component is based on the difference between the first estimated parameter and the second estimated parameter.

17. The method of claim 16, wherein the downhole component is configured to be deployed within a target formation layer in the formation region, the target formation layer having a target parameter value, the target formation layer adjacent to a second formation layer having a second parameter value that is different than the target parameter value, and the downhole component is steered based on the difference between the first estimated parameter and the second estimated parameter to maintain the downhole component in the target formation layer.

18. The method of claim 17, wherein steering the downhole component includes determining that the downhole component is in a transition region between the target formation layer and the second formation layer based on the difference, identifying a sector of the at least one sector, the identified sector having the second parameter value that corresponds to the target formation layer, and steering the downhole component in a direction of the identified sector.

19. The method of claim 15, wherein the at least one NMR assembly includes a plurality of NMR assemblies disposed at a selected axial location relative to a longitudinal axis of the borehole string, the plurality of NMR assemblies located at different angular locations relative to the longitudinal axis of the borehole string at the selected axial location.

20. The method of claim 19, wherein each of the plurality of NMR assemblies includes a transmitter coil and a receiver coil, each receiver coil is connected to a respective processing module or all of the receiver coils are connected to a single processing module, and each transmitter coil is driven by a respective electronics module or all of the transmitter coils are driven by a single electronics module.

* * * * *